(12) United States Patent
Zhang et al.

(10) Patent No.: US 8,022,849 B2
(45) Date of Patent: Sep. 20, 2011

(54) PHASE TO DIGITAL CONVERTER IN ALL DIGITAL PHASE LOCKED LOOP

(75) Inventors: Gang Zhang, San Diego, CA (US);
Abhishek Jajoo, Pittsburgh, PA (US);
Yiping Han, La Jolla, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 20 days.

(21) Appl. No.: 12/102,768

(22) Filed: Apr. 14, 2008

(65) Prior Publication Data

US 2009/0256601 A1    Oct. 15, 2009

(51) Int. Cl.
*H03M 1/00*    (2006.01)
(52) U.S. Cl. ........................................ 341/142; 341/155
(58) Field of Classification Search .................. 341/111, 341/118, 142, 155, 156, 126
See application file for complete search history.

(56) References Cited

U.S. PATENT DOCUMENTS

| | | | | |
|---|---|---|---|---|
| 6,570,454 | B2 * | 5/2003 | Skierszkan | 331/2 |
| 7,145,975 | B2 | 12/2006 | Yen et al. | |
| 7,403,073 | B2 * | 7/2008 | Kossel et al. | 331/16 |
| 7,425,874 | B2 * | 9/2008 | Risbo et al. | 331/1 A |
| 7,495,488 | B2 * | 2/2009 | Kim | 327/159 |
| 7,656,208 | B2 * | 2/2010 | Kimura et al. | 327/159 |

FOREIGN PATENT DOCUMENTS

WO   WO2008005853   1/2008

OTHER PUBLICATIONS

International Search Report and Written Opinion—PCT/US09/040555—International Search Authority EPO—Sep. 29, 2009.
Lin, J. et al., "A PVT tolerant 0.18MHz to 600MHz self-calibrated digital PLL in 90nm CMOS process", Solid-State Circuits Conference, 2004. Digest of Technical Papers. ISSCC. 2004 IEEE International Publication Year: 2004, pp. 488-541 vol. 1.
Volodymyr, et al: "A design procedure for All-digital phase-locked loops based on a charge-pump-phase-locked-loop analogy," IEEE Transactions on Circuits and Systems II: Express Briefs, vol. 54, No. 3, Mar 1, 2007, pp. 247-251, ISSN: 1057-7130, Sections II-III, figs 2-4.

* cited by examiner

*Primary Examiner* — Brian Young
(74) *Attorney, Agent, or Firm* — Larry J. Moskowitz; Ramin Mobarhan

(57) ABSTRACT

A phase to digital converter, all digital phase locked loop, and apparatus having an all digital phase locked loop are described herein. The phase to digital converter includes a phase to frequency converter driving a time to digital converter. The time to digital converter determines a magnitude and sign of the phase differences output by the phase to frequency converter. The time to digital converter utilizes tapped delay lines and looped feedback counters to enable measurement of small timing differences typical of a loop tracking process and large timing differences typical of an loop acquisition process. The tapped delay lines permit the measurement of fractions of a reference period and enable lower power operation of the phase to digital converter by reducing requirements on the speed of the reference clock.

44 Claims, 16 Drawing Sheets

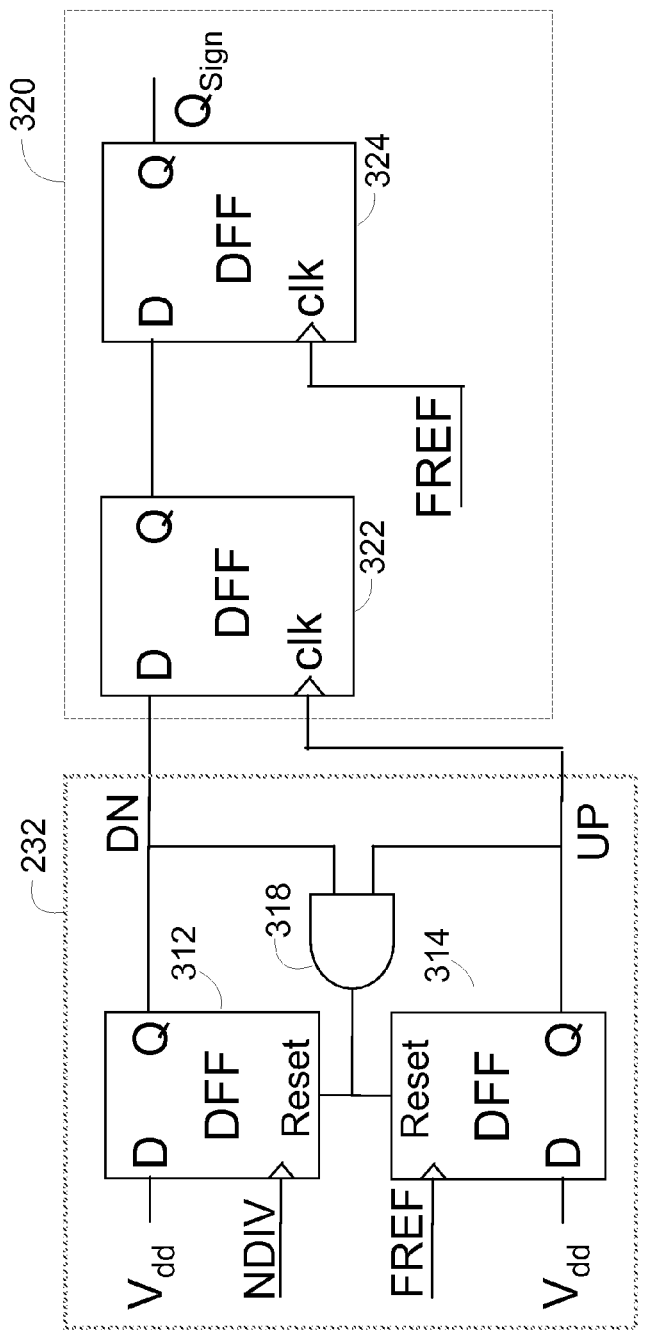
FIG. 3A
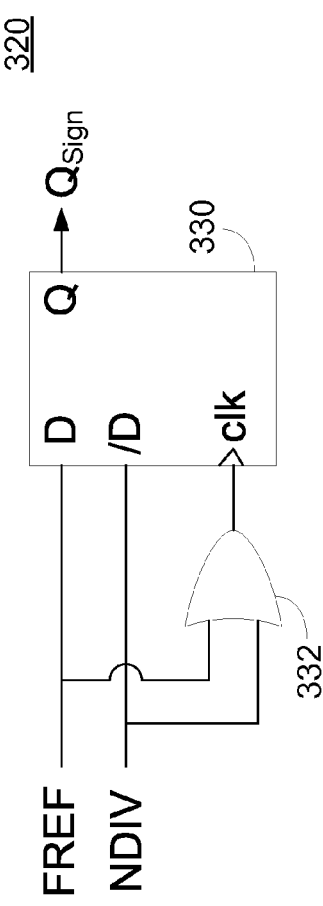
FIB. 3B

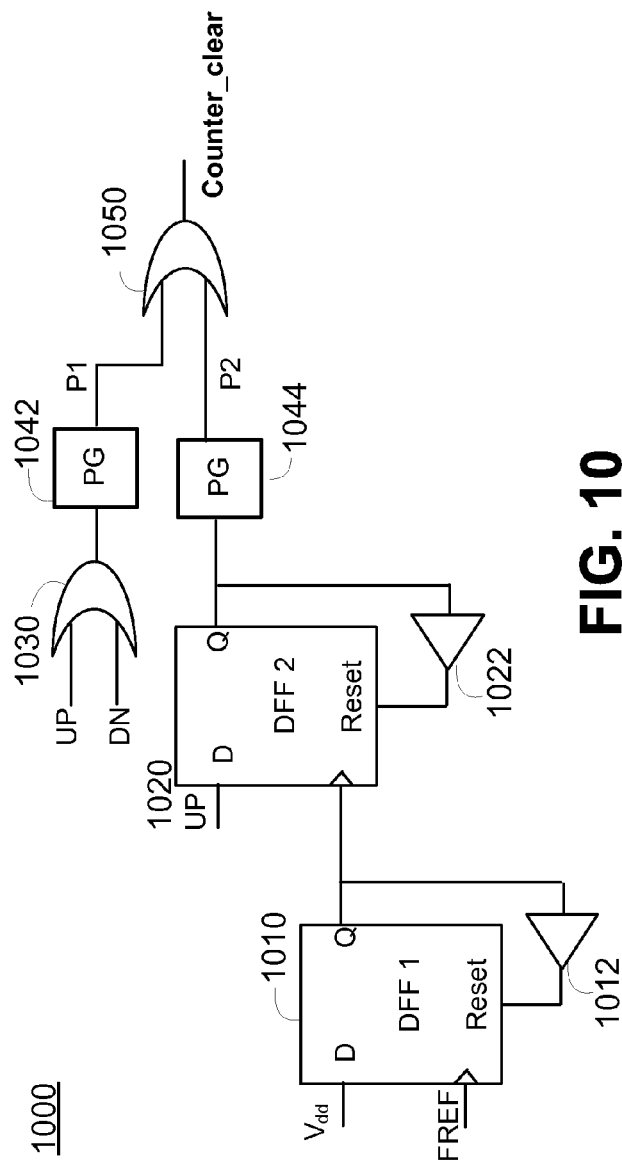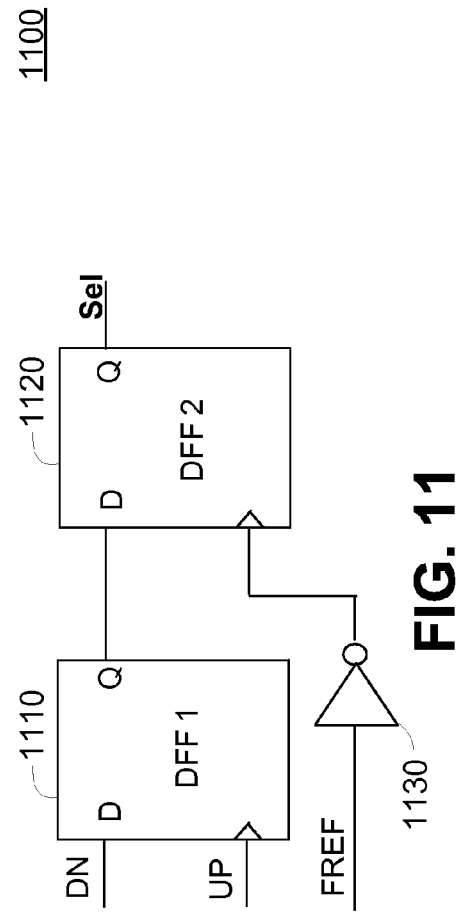
FIG. 10
FIG. 11

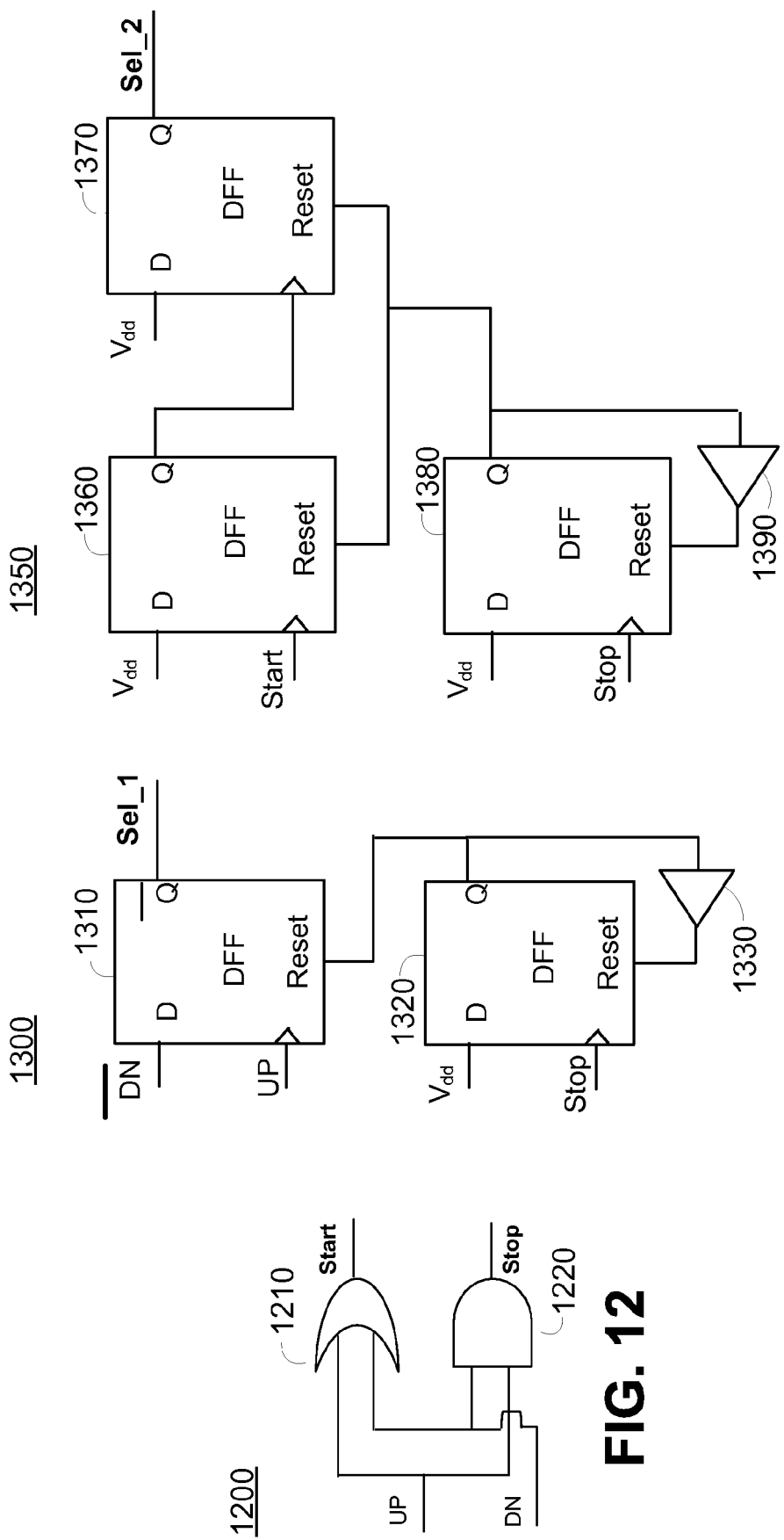

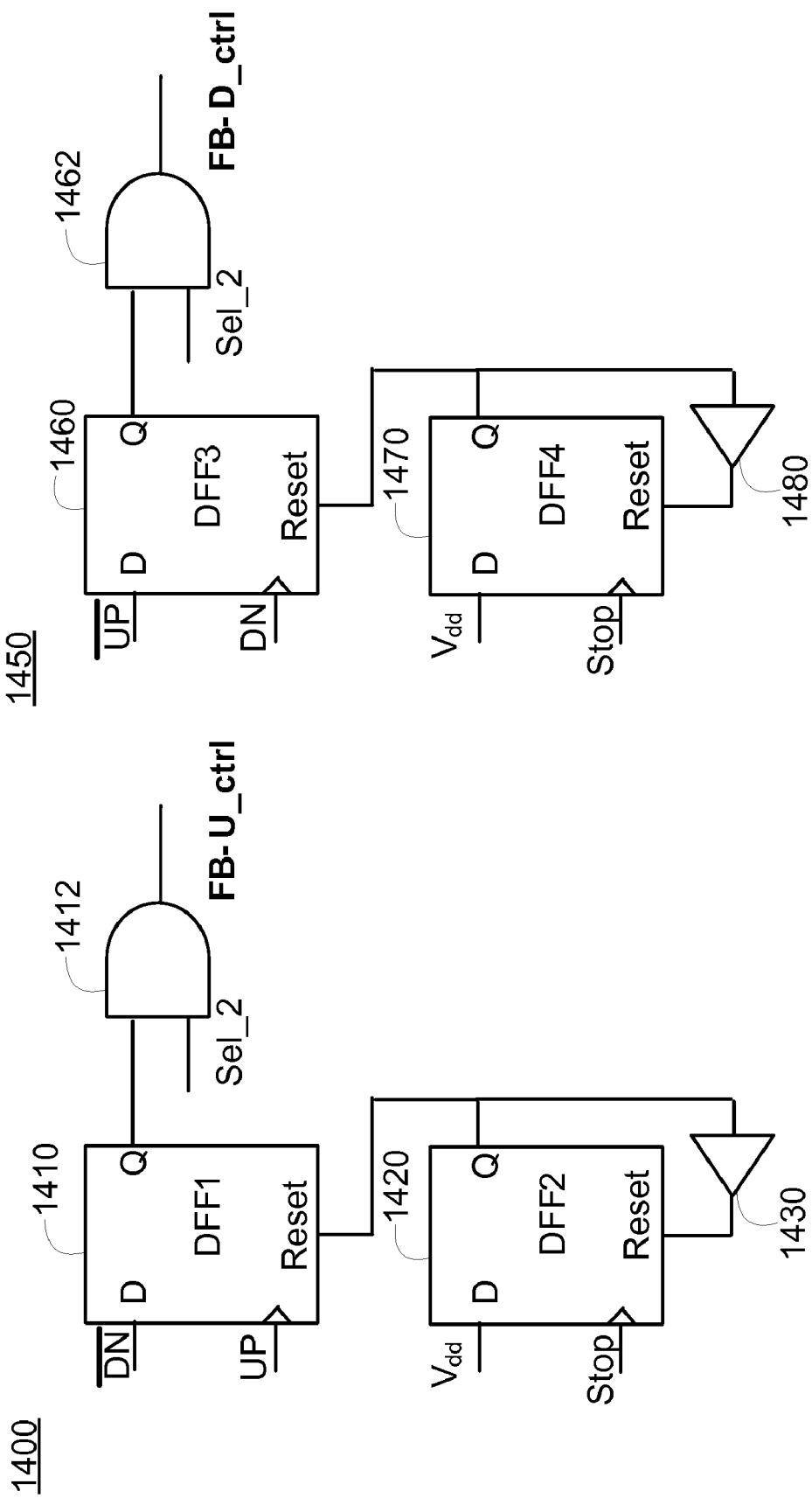

PHASE TO DIGITAL CONVERTER IN ALL DIGITAL PHASE LOCKED LOOP

BACKGROUND

1. Field of the Invention

The invention relates to the field of electronic circuits. More particularly, the invention relates to the field of oscillators and phase locked loops (PLLs).

2. Description of Related Art

Phase and frequency controlled oscillators are used in a variety of electronic applications to provide stable, controlled, frequency references. A digital device may use a frequency controlled oscillator as a clock source for timing, for example, as a clock for a digital microprocessor circuit. An analog device may include a phase locked oscillator as a local oscillator used to frequency convert Radio Frequency (RF) signals. The phase and frequency controlled oscillator may be fixed frequency oscillator or may be a tunable oscillator that is implemented using a programmable frequency synthesizer.

A frequency controlled oscillator for a digital device may be implemented digitally, while a phase locked oscillator for an analog device may be implemented using exclusively analog building blocks. However, as the operating speeds of digital circuits increase, it is becoming more feasible to implement at least portions of a phase locked oscillator for traditionally analog applications using digital building blocks.

Some of the improvements in the operating speeds of digital circuits can be attributable to improvements in the processes uses to manufacture the digital circuits. Improvements in processes that shrink the size of the underlying transistors utilized in digital integrated circuit designs are related to improvements in operating speeds. CMOS circuits may be implemented using sub-micron processes, such as 90 nm, 65 nm, 45 nm, or 35 nm processes.

The supply voltage utilized in CMOS circuits have continually decreased due in part to decreases in dimensions and also due in part to desires to reduce the overall power consumed by such devices. In advanced CMOS processes, such as 65 nm, the power supply voltage is typically reduced to around 1.1V. At this low voltage, conventional analog building blocks such as operation amplifiers and current mirrors don't work well and are difficult to design. Thus, a conventional analog PLL is difficult to design with such process. In addition, an analog PLL typically needs large area to implement a filter function, while at 65 nm, silicon unit area is more expensive than die area for larger processes.

The advancements in digital processes result in greater constraints on the ability to implement traditional analog circuits, such as a PLL. Additionally, the advanced digital processes make traditional analog implementations more expensive. It is desirable to capitalize on the process improvements in the digital domain while minimizing the negative effects on circuits traditionally implemented using analog building blocks.

BRIEF SUMMARY

A phase to digital converter, all digital phase locked loop, and apparatus having an all digital phase locked loop are described herein. The phase to digital converter includes a phase to frequency converter driving a time to digital converter. The time to digital converter determines a magnitude and sign of the phase differences output by the phase to frequency converter. The time to digital converter utilizes tapped delay lines and looped feedback counters to enable measurement of small timing differences typical of a loop tracking process and large timing differences typical of a loop acquisition process. The tapped delay lines permit the measurement of fractions of a reference period and enable lower power operation of the phase to digital converter by reducing requirements on the speed of the reference clock.

A PDC can take reference clock (FREF) and fractional N-divider output (NDIV) as inputs and can provide a digital representation of their phase difference as output. The PDDC updates the output every FREF edge (where by FREF edge refers to the rising edge, unless specified) and the output following an FREF edge corresponds to an UP-DOWN signal pair generated by a Phase to Frequency Detector in which the previous FREF edge was involved. If an UP-DOWN pair extends over more than one FREF cycle (which will happen if FREF comes first, i.e. starts the pair, and NDIV edge doesn't come before next FREF edge) then the phase difference is broken up into subdivisions at FREF edges such that no UP-DOWN pair is longer than TREF (1/FREF) and every sub-division is considered as a separate UP-DOWN pair. The PDC can provide the output as a counter and digital output from a tapped delay line. When the counter output (binary coded C<0:4>) is non-zero, delay line output (thermometer coded D<0:47>) can be ignored as this is a case of large phase difference (>~1.5 ns), which is typical of an acquisition period of an phase locked loop, and in which reduced accuracy is acceptable.

Aspects of the invention include a method of phase to digital conversion. The method includes initiating a first pulse based on an earlier arriving edge of one of a reference clock and an oscillator signal, coupling the first pulse through a delay line, determining a conversion termination signal based on a later arriving edge of one of the reference clock and the oscillator signal, and determining a digital value of a phase difference between the reference clock and the oscillator signal based on a transition of the first pulse through the delay line.

Aspects of the invention include a method of phase to digital conversion. The method includes generating at least one phase to frequency detection signal based on transitions of an oscillator signal and transitions of a reference clock, generating a signal pulse based on the at least one phase to frequency conversion signal, and generating a digital value of a phase difference based on a transition of the signal pulse through a delay line.

Aspects of the invention include a method of phase to digital conversion. The method includes receiving an oscillator signal, receiving a reference clock, generating at least one phase to frequency detection signal including an UP signal and a DOWN signal based on transitions of the oscillator signal and transitions of the reference clock, generating a read signal based on the UP signal and the DOWN signal, generating a first signal pulse based on the UP signal, generating a second pulse signal based on the DOWN signal, coupling the first signal pulse to a first delay line, coupling the second pulse signal to a second delay line, counting a number of full transitions of one of the first signal pulse or second signal pulse through its respective delay line based on transitions of the UP signal relative to the DOWN signal, and determining a digital value of a phase difference based on at least one of the number or a partial transition of one of the first signal pulse or the second signal pulse through the respective first delay line and second delay line.

Aspects of the invention include a phase to digital converter that includes a path selection multiplexer configured to receive a reference clock signal at a first input and an oscillator signal at a second input, and further configured to output one of the reference clock signal or oscillator signal based on a control input signal, a first pulse generator having a trigger input coupled to the output of the path selection multiplexer, a loop multiplexer configured to receive a pulse generator output at a first input and a delayed pulse signal at the second input, and configured to output one of the pulse generator output or the delayed pulse signal based on a loop control signal, a delay line coupled to the output of the loop multiplexer and configured to output the delayed pulse signal, and further configured to indicate a fractional pulse transition upon receipt of a conversion termination signal, and a counter configured to count a number of pulses output by the delay line and configured to output the number upon receipt of the conversion termination signal.

Aspects of the invention include a phase to digital converter that includes a first signal processing path configured to determine a magnitude of a phase difference between an oscillator signal and a reference clock based at least one of a fractional transition of a pulse through a delay line and a number of full transitions of the pulse through the delay line, and a sign generator configured to receive the oscillator signal and the reference clock and configured to determine a sign of the phase difference.

Aspects of the invention include a phase to digital converter that includes a phase to frequency detector configured to generate an UP signal and a DOWN signal based on an oscillator signal and a reference clock, a pulse generator coupled to the phase to frequency detector and configured to generate a pulse signal based on one of the UP signal and the DOWN signal, a tapped delay line coupled to the pulse generator, a counter configured to increment based on an output of the delay line, a register coupled to the tapped delay line, and a read control generator configured to generate a read signal based on the UP signal and the DOWN signal, and configured to latch a digital value of a phase difference in at least one of the register or the counter.

Aspects of the invention include a phase to digital converter that includes means for generating a phase to frequency detection signal including an UP signal and a DOWN signal based on transitions of an oscillator signal and transitions of a reference clock, means for generating a conversion Start signal and a conversion Stop signal based on the UP signal and the DOWN signal, means for generating a pulse based on one of the UP signal and the DOWN signal, means for delay coupled to the means for generating the pulse, means for counting coupled to an output of the means for delay, and means for converting a time to a digital value of a phase difference based on the Start signal and the Stop signal and further based on an output of the means for counting and a fractional transition of the pulse through the means for delay.

Aspects of the invention include an all digital phase locked loop (ADPLL). The ADPLL includes a digital controlled oscillator (DCO), a digital divider having an input coupled to the DCO and an output configured to provide a digital divided output signal, a phase to frequency detector having a first input coupled to a reference oscillator clock and a second input coupled to the output of the digital divider, the phase to frequency detector configured to generate an UP signal and a DOWN signal based on the digital divided output signal and the reference oscillator clock, a phase to digital converter having a first input receiving the UP signal, a second input receiving the DOWN signal, and a third input receiving the reference oscillator clock, the phase to digital converter configured to generate a pulse signal based on one of the UP signal or the DOWN signal and further configured to determine a digital value of a phase difference between the digital divided output signal and the reference oscillator clock based on at least one of full transitions of the pulse signal through a delay line and partial transitions of the pulse through the delay line, and a digital loop filter having an input coupled to an output of the phase to digital converter and an output coupled to a control input of the DCO.

BRIEF DESCRIPTION OF THE DRAWINGS

The features, objects, and advantages of embodiments of the disclosure will become more apparent from the detailed description set forth below when taken in conjunction with the drawings, in which like elements bear like reference numerals.

FIGS. 3A-3B are simplified functional block diagrams of an embodiment of a phase to frequency detector and embodiments of sign generators.

FIG. 10 is a simplified schematic of an embodiment of a counter clear generator.

FIG. 11 is a simplified schematic diagram of an embodiment of a 'Sel' control signal generator.

FIG. 12 is a simplified schematic of an embodiment of a Start/Stop generator.

FIGS. 13A and 13B illustrate embodiments of generators for the Sel_1 and Sel_2 signals.

FIGS. 14A and 14B illustrate embodiments of generators for feedback control signals.

DETAILED DESCRIPTION OF EMBODIMENTS OF THE INVENTION

Figure 1:
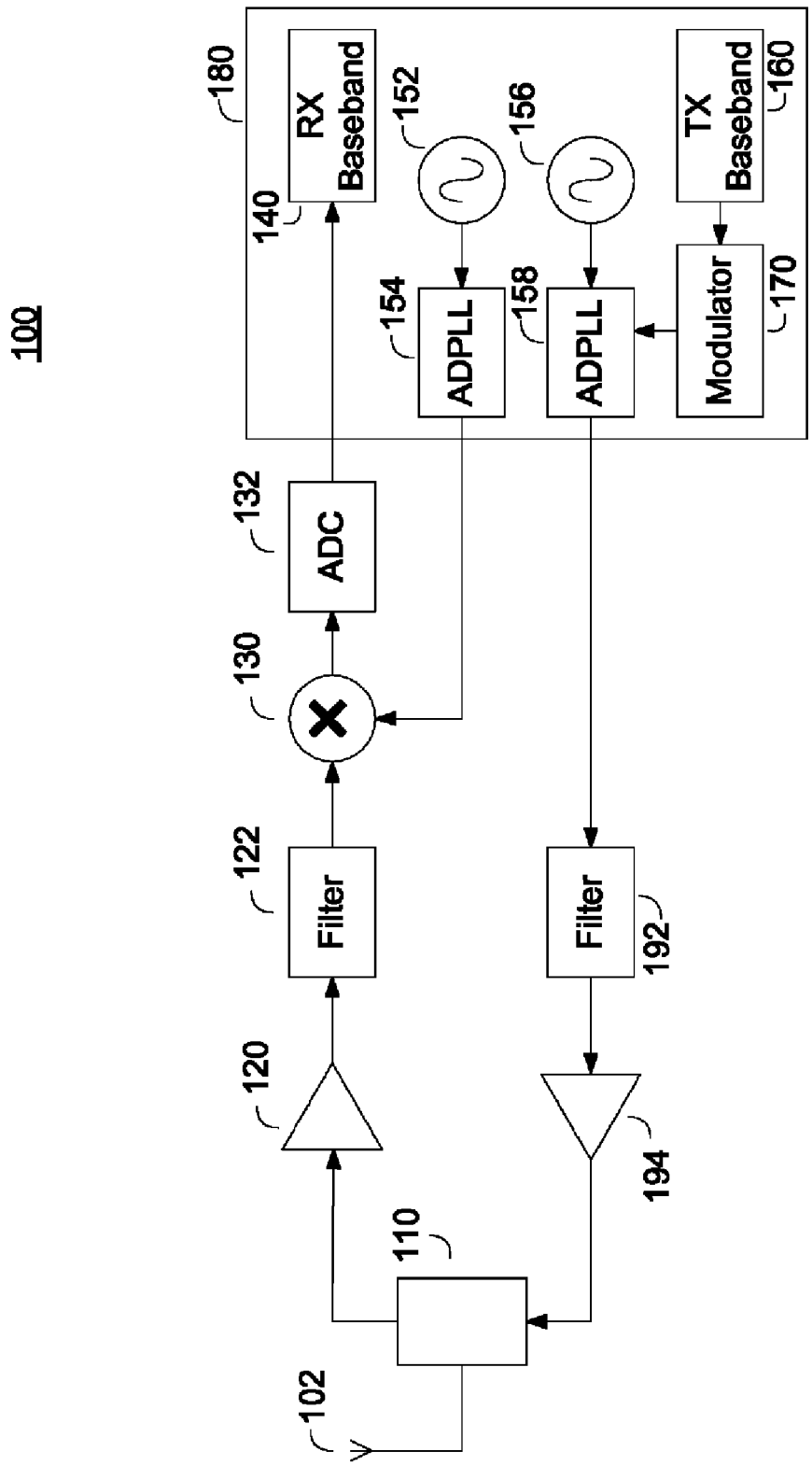
FIG. 1 is a simplified functional block diagram of an embodiment of a wireless communication device having all digital phase locked loops.

An All Digital Phase Locked Loop (ADPLL) is described herein that implements all PLL functions in digital circuitry with reduced silicon area and no off-chip components. The digital PLL can work at low power supply voltage. A phase to digital converter (PDC) design described herein forms a major operational block that enable the all digital PLL.

The proposed PDC converts analog phase information into a digital word which can in turn be fed into a digital signal processor. The PDC operates to convert the input phase information with fine resolution and high linearity, especially around the zero phase transition point. Due to device mismatches, a PDC may convert the positive phase and negative phase inputs with different gains or offsets. The different gains or offsets are equivalent to nonlinearity in a PDC conversion transfer function. This nonlinearity degrades overall PLL performance and operates ton increase phase noise and spurious response. The proposed ADPLL with PDC resolves nonlinearities with a symmetrical topology. The PDC described herein also covers a wide phase input range during PLL acquisition and locking modes. The proposed ADPLL and in particular the PDC described herein supports wide phase input ranges that typically occur during acquisition by implementing an edge recycling counter that contributes little power consumption overhead.

The PDC can convert both sign and magnitude of a phase signal to digital word for digital signal processing and can be used in an all digital PLL in deep submicron process and low power supply voltage. The proposed PDC can convert both large phase (wide pulses) inputs on the order of tens of nanoseconds and small phase (narrow pulse) inputs down to tens of picoseconds. Support for both wide and narrow phases is needed to support different PLL operating conditions, namely, acquisition and locked modes. Large phase inputs are processed by an edge recycling counter without power consumption overhead.

The PDC processes both large and small input phase signals by implementing a fine delay line to process the small phase inputs and an edge recycling counter to process the large phase inputs. The PDC achieves high linearity even when processing both negative and positive phase inputs by having a symmetrical topology for UP and DOWN signals that are generated based on an oscillator signal and a reference clock. Delay mismatches in the symmetric portions will typically introduce an offset but not nonlinearity. The delay in a DFF (D flip-flop) is measured and subtracted from the results. In addition, other techniques, such as pulse generation and flush control, are used in the PDC to achieve overall functions utilized in steady state operation of an ADPLL.

The ability to determine both fine and coarse phase to digital conversion as well as perform linearly permits the ADPLL and PDC to be implemented in traditionally analog configurations, such as RF applications that typically require higher performance than is typically required in an oscillator for a digital microprocessor application.

FIG. 1 is a simplified functional block diagram of an embodiment of a wireless communication device 100 having all digital phase locked loops. The wireless communication device 100 is implemented as a transceiver having distinct transmit and receive processing paths. Each of the transmit and receive processing paths may implement and utilize an ADPLL as part of a local oscillator circuit. Distinct transmit and receive oscillators permit full duplex operation, in which the wireless communication device 100 concurrently transmits and receives signals.

The wireless communication device 100 includes an antenna 102 that can be shared by both the transmit and receive processing paths. The antenna 102 couples received wireless signal to a duplexer 110 that can be configured to couple the receive signals from the antenna 102 to the remainder of the receive operating path while isolating the receive path from transmit signals. The receive output from the duplexer 110 is coupled to a front end amplifier 120, which can be, for example, a low noise amplifier (LNA). The front end amplifier 120 typically operates to substantially govern the total receiver noise figure, and thus, is typically implemented as an LNA having 10-20 dB of gain. The output from the front end amplifier 120 is coupled to a receive RF filter 122.

The receive RF filter 122 operates to perform RF selection by eliminating or otherwise attenuating signals outsider a desired receive RF operating band. The RF filter 122 can, for example, contribute to adjacent channel rejection. The output from the receive RF filter 122 can be coupled to an RF input of a frequency converter, here depicted as a mixer 130. The second input to the mixer 130 is driven by a local oscillator signal that can be generated by a first ADPLL 154 that is substantially or wholly implemented within a transceiver integrated circuit 180 that is manufactured using an advanced CMOS process, such as a 65 nm process.

The output from the mixer 130 can be a baseband signal that is coupled to an Analog to Digital Converter 132 that operates to generate a digital representation of the baseband signal. The digital baseband signal is coupled to a receive input of the transceiver integrated circuit 180. The receive input of the transceiver integrated circuit 180 couples the digital baseband signal to a receive baseband processor 140 for further processing.

The transceiver integrated circuit 180 includes a first ADPLL 154 operating in conjunction with a first frequency reference 152 to generate a first oscillator signal. The first oscillator signal can be used as a local oscillator for the receive frequency translation operation. The first oscillator signal output from the first ADPLL 154 can be coupled to the LO input of the mixer 130 to frequency convert the receive signal to baseband.

The receiver embodiment illustrated in FIG. 1 implements a direct conversion technique in which the receive RF signal is converted to baseband in a single frequency conversion stage. Of course, the receiver in the wireless communication device 100 is not limited to any particular configuration and may utilize direct conversion, super heterodyne, or some other configuration.

The wireless communication device 100 can include a complementary transmitter. The transmitter can include signal generation portion in the transceiver integrated circuit 180 that substantially generates the transmit signal. A transmit baseband processor 160 can be configured to interface with a data source (not shown) and can format the data for subsequent transmission.

The transmit baseband processor 160 can be configured, for example, to provide the transmit baseband signal to a modulator 170. The modulator 170 can be configured to directly modulate the baseband signal onto a second oscillator signal. The modulator 170 can be, for example, a two point modulator.

A second ADPLL 158 in conjunction with a second frequency reference 156 can generate the second oscillator signal, which can be, for example, at the desired transmit RF. Although the second frequency reference 156 is depicted as distinct from the first frequency reference 152, both the first ADPLL 154 and the second ADPLL 158 can share the same frequency reference, e.g. first frequency reference 152. The second ADPLL 158 can be configured to accept the modulation signal from the modulator 170 and can directly modulate the transmit signal onto the second oscillator signal.

The output from the second ADPLL 158 can be coupled to a transmit RF filter 192 that can operate to substantially eliminate undesired products, including spurious products and harmonics, that may be output by the second ADPLL 158. The output from the transmit RF filter 192 is coupled to a transmit amplifier 194 that may alternatively be referred to as a high power amplifier (HPA). The transmit amplifier 194 can have a variable gain or a variable gain stage and can be configured to amplify the modulated second oscillator signal to a desired transmit power level. The output from the transmit amplifier 194 is coupled to a transmit input of the duplexer 110 where it is coupled to the antenna 102.

The transceiver integrated circuit 180 can be implemented in an advance submicron CMOS process operating on a low power supply voltage, such as 1.1V, and can implement the first and second ADPLLs 154 and 158 entirely on board the integrated circuit without the need for any off chip elements, such as off chip passive devices, off chip analog devices, or off chip oscillators. The ability to use relatively frequency reference clocks having a period that is much larger than a phase resolution of the phase to digital converter permits the ADPLLs 154 and 158 to operate at relatively low current consumption levels, which translates to relatively low power consumption.

Figure 2:
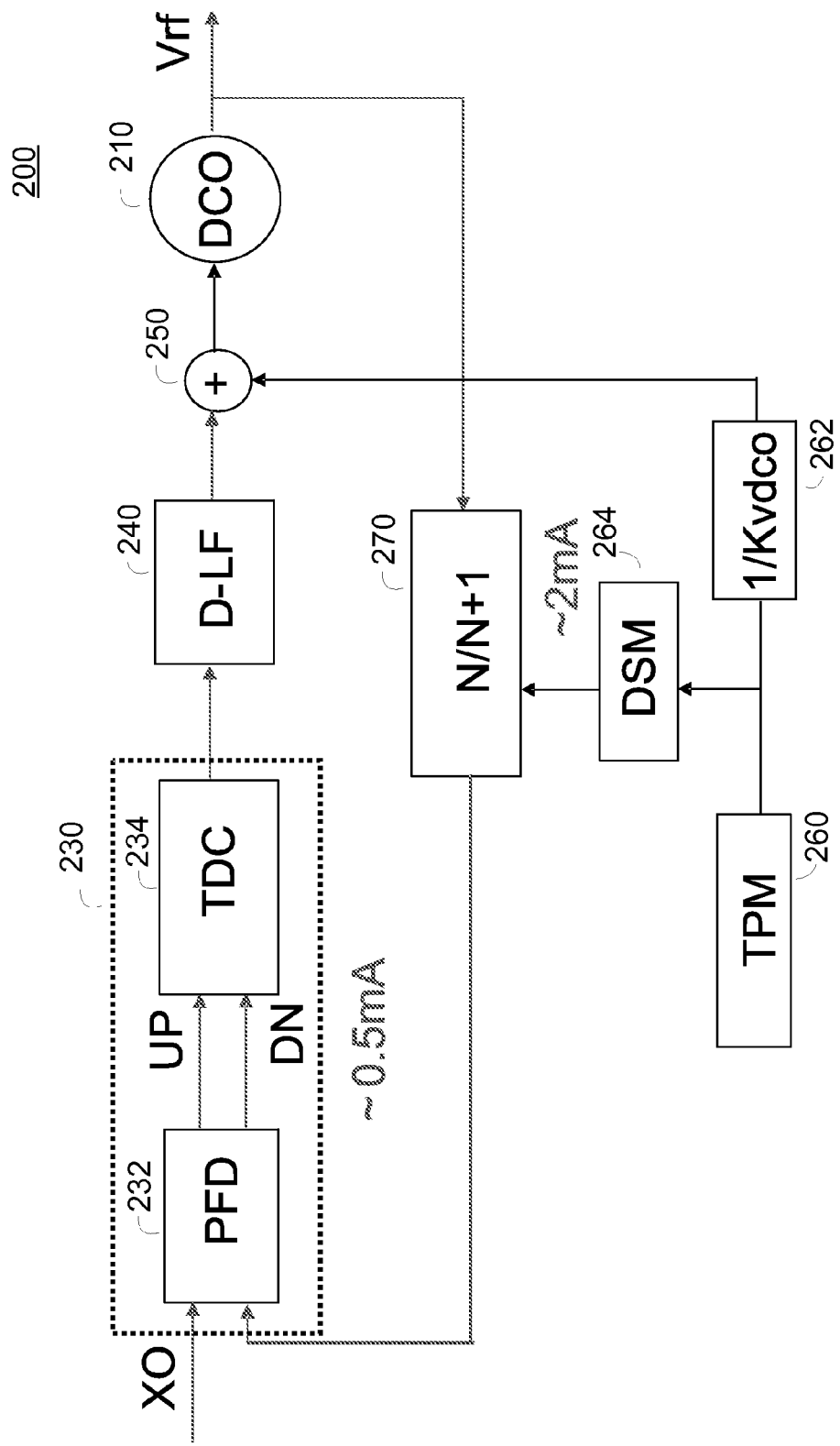
FIG. 2 is a simplified functional block diagram of an all digital phase locked loop.

FIG. 2 is a simplified functional block diagram of an all digital phase locked loop 200. The ADPLL 200 of FIG. 2 can be, for example, the second ADPLL of the wireless communication device of FIG. 1, and can be the first ADPLL of the wireless communication device of FIG. 1 if the modulation portion is omitted or otherwise unused.

The ADPLL 200 includes a variable oscillator, which can be a digital controlled oscillator (DCO) 210 whose output is the phase and frequency controlled output from the ADPLL 200. The output from the DCO 210 is also coupled to a divider 220, which can be, for example, an integer divider or a fractional divider. The divider 220 can be programmed or otherwise controlled to provide a division ratio that tunes the output frequency of the DCO 210 to the desired frequency. The control signal for the divider 220 can be determined, for example, at a baseband controller or some other processor (not shown).

The divided output is coupled to an input of a Phase to Digital Converter (PDC) 230. A reference oscillator (not shown), which can be, for example, a crystal oscillator, is coupled to a reference input of the PDC 230.

The PDC 230 includes a Phase to Frequency Detector 232 coupled to a Time to Digital converter (TDC) 234. The PDC 230 is described in much greater detail with respect to other figures. In general, the PDC 230 compares the phase of the reference oscillator against the phase of the divided output and provides a digital value indicative of the phase difference. The output from the PDC 230 can be expressed, for example as a sign and a magnitude, as a two's complement value, or as some other digital format. The digital value output from the PDC 230 is coupled to a loop filter 240 that can be implemented as a digital loop filter. The output from the loop filter 240 is coupled to a first input of a signal combiner 250, here depicted as a signal summer.

The signal combiner 250 is implemented as a portion of a modulation circuit and can be omitted from those ADPLL 200 configurations not needing modulation. The output from the combiner 250 is coupled to the control input of the DCO 210.

The modulation circuit is configured to implement two point modulation. A two-point modulator 260 is configured to receive a transmit signal, such as a transmit baseband signal from a transmit data source (not shown). The two-point modulator 260 processes the transmit signal and drives a closed-loop and open-loop modulation inputs in the ADPLL 200.

The output of the two-point modulator 260 is coupled to a delta-sigma modulator (DSM) 264 that drives the fractional divider to implement closed loop modulation of the ADPLL 200. The output of the two-point modulator 260 also drives a scaler 262 that drives the second input to the combiner 250 to introduce open loop modulation of the ADPLL 200 output. The scaler 262 can be configured to compensate for the gain of the DCO 210. However, the value of the scaler 262 need not be related to the gain of the DCO 210 and can be configured to provide a gain that operates in conjunction with the output of the two-point modulator 260 to provide the desired modulation.

FIG. 3A is a simplified functional block diagram of an embodiment of a phase to frequency detector 232 coupled to a sign generator 320. The phase to frequency detector 232 can be, for example, the phase to frequency detector of the ADPLL of FIG. 2. The sign bit output from the sign generator 320 can indicate, for example, if the divider input to the phase to frequency detector 232 leads or lags the reference clock from the reference oscillator.

The phase to frequency detector 232 can be implemented as an UP/DOWN counter controller. Although the UP and DOWN outputs can be used to drive the corresponding inputs to an UP/DOWN counter, hence the names. Although the time to digital converter described herein as part of the PDC does not utilize UP and DOWN counts, it may be helpful to refer to the outputs of the PFD 232 as UP and DOWN output signals to permit comparisons to implementations using an UP/DOWN counter. Of course, the labels UP and DOWN are arbitrary and the PFD 232 outputs could be labeled as first and second outputs or by some other distinguishing name.

The PFD 232 includes two D-Flip-Flops (DFF), 312 and 314, having a high input value, Vdd, coupled to each of the D inputs. The two DFFs 312 and 314 are both described as being rising edge triggered, but could be reconfigured to utilize any combination of rising edge and falling edge triggers.

The PFD 232 receives the divided signal from frequency divider coupled to the DCO, NDIV, at the clock input to the first DFF 312. The first DFF 312 clocks the Vdd value to the Q output to output an active high DOWN signal at the rising edge of the NDIV signal. Similarly, the second DFF 314 receives the reference clock, FREF, at the clock input and clocks the Vdd value to the Q output to output an active high UP signal at the rising edge of the FREF signal.

A two-input AND gate 318 has a first input coupled to the Q output from the first DFF 312 and a second input coupled to the Q output from the second DFF 314. The output of the AND gate 318 is coupled to the Reset inputs of the first and second DFFs 312 and 314. The AND gate 318 operates to reset both DFFs 312 and 314 after each UP/DOWN pair.

The sign generator 320 operates on the UP and DOWN outputs from the PFD 232 as well as the FREF signal. However, the sign generator 320 can also be reconfigured to operate to use the NDIV signal.

The output from the sign generator 320 indicates which input, UP or DOWN, arrives first to the sign generator 320. The DOWN output from the PFD 232 is coupled to the D input of a first sign DFF 322 and the UP output from the PFD 232 is coupled to the clock of the first sign DFF 322. The DOWN output from the PFD 232 is sampled by the rising edge of the UP signal to indicate the sign of the current UP/DOWN pair.

The sign of the UP/DOWN pair is read by a second sign flip-flop 324 clocked by the reference clock FREF. The Q output from the second sign DFF 324 indicates the Sign output of the system. The 'Sign' output indicates the sign of the UP/DOWN pair in which the previous FREF edge was involved. The reason for using 'UP' to sample 'DOWN' is that 'UP' edge comes with every FREF edge whereas the 'DOWN' signal does not have such predictability. If the duration of an UP/DOWN pair is longer than one FREF period then there is no 'UP' edge with every FREF edge. But in this situation the sign for every FREF period belonging to the wide phase difference is same as it was in the beginning of the current phase difference. Therefore the output of the first sign DFF 322 would be the correct sign to read at every FREF edge by the second sign DFF 324.

FIG. 3B is an alternative embodiment of a sign generator 320 that does not rely on a phase to frequency detector, but instead, determines the sign directly from the two inputs, FREF and NDIV to a phase to digital converter.

The sign generator 320 embodiment of FIG. 3B includes a D-Flip-Flop (DFF) 330 and an OR gate 332. The reference clock signal, FREF, is coupled to the D input to the DFF 330. The divided signal (NDIV) from the frequency divider coupled to the DCO is coupled to the inverted D input (/D) of the DFF 330. The output of the DFF 330 indicates the sign.

The reference clock signal, FREF, is also coupled to a first input of a logical OR gate 332. The divided signal, NDIV, is coupled to the second input of the logical OR gate 332. The output from the OR gate 332 is coupled to the clock in put of the DFF 330. Thus, the earlier of the FREF or NDIV signal clocks the DFF 330. The inputs to the DFF 330 effectively operate as a differential input signal whose phase at the clock edge indicates the sign.

Figure 4A:
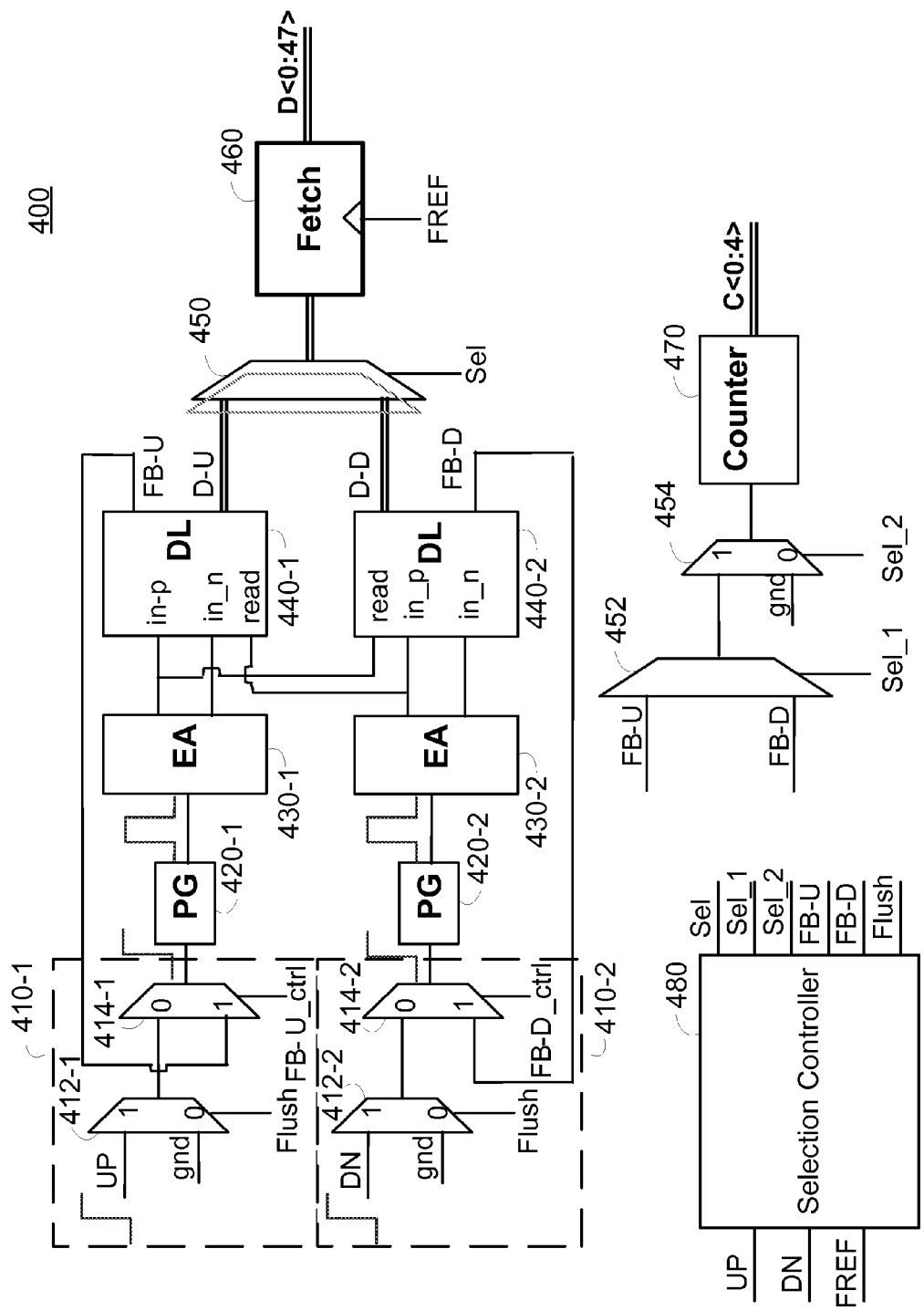
FIG. 4A is a simplified functional block diagram of an embodiment of a time to digital converter.

FIG. 4A is a simplified functional block diagram of an embodiment of a magnitude converter portion of a time to digital converter 400. The magnitude converter portion 400 can be used in conjunction with the sign generator and PFD of FIG. 3A to implement a phase to digital converter, such as the phase to digital converter of FIG. 2. The magnitude converter portion 400 of the time to digital converter can be implemented, for example, within the PDC of FIG. 2 in order to facilitate the implementation of an ADPLL having low current requirements yet providing high phase resolution.

The magnitude converter portion 400 includes symmetric processing paths, with a first processing path triggered by the UP signal from a PFD and a second processing path triggered by the DOWN signal from the PFD. The results from one of the first or second processing path are selected for the magnitude value based on selection processing.

The first processing path includes first control multiplexers 410-1 that are used to initialize the processing path. The first processing path includes a flush multiplexer 412-1 that selectively couples one of the UP signal or a predetermined signal to the processing path. In the embodiment of FIG. 4A, the flush multiplexer 412-1 selectively couples a low or zero value to the processing path in order to flush out prior contents of the processing path to ensure the processing path begins at a known state. During time to digital conversion, the flush multiplexer 412-1 couples the UP signal to the processing path.

The output from the flush multiplexer 412-1 is coupled to an input of a feedback control multiplexer 414-1 that operates to selectively feed back a pulse that has traversed an entire delay in the processing path. The feedback control multiplexer 414-1 initially selects the flush multiplexer 412-1 output and selects the feedback pulse if the time to digital conversion has yet to complete.

The output from the control multiplexers 410-1 are coupled to a control input of a pulse generator 420-1. The output of the pulse generator 420-1 is coupled to an edge aligner 430-1 that operates to substantially align the timing of the rising and falling edges of the pulse output from the pulse generator 420-1.

The edge aligner 430-1 is depicted as generating a differential output that is coupled to a delay line 440-1. The delay line 440-1 introduces a predetermined fixed delay to the pulse signal output by the pulse generator 420-1 and aligned in the edge aligner 430-1.

The delay line 440-1 can be configured as a tapped delay line, and each tap of the tapped delay line can be coupled to a first path selection multiplexer 450. The first path selection multiplexer 450 selectively routes one of the first processing path or second processing path differential tapped delay line tap values to a fetch register 460. The output of the fetch register 460 represents a fractional delay through the delay line.

The delay line 440-1 can be configured to output a single ended delayed pulse signal. The single ended output from the delay line 440-1 represents the feedback pulse that is routed to the second input of the feedback control multiplexer 414-1.

The single ended output from the delay line 440-1 is also coupled to a second path selection multiplexer 452 that selectively routes one of the first processing path or second processing path to an input of a counter enable multiplexer 454. The counter enable multiplexer 454 outputs an enable signal to a counter 470 that operates to count the number of full delay transitions of a pulse through the delay line.

The second processing path is configured substantially identical to the first processing path. Second control multiplexers 410-2 include a second flush multiplexer 412-2 having one input coupled the PFD to receive the DOWN signal and a second input configured to receive the low logic level. The output of the second flush multiplexer 412-2 is coupled to a second feedback control multiplexer 414-2 that selectively couples the output from the second flush multiplexer 414-2 or a delayed pulse signal to its output.

The output from the second feedback control multiplexer 414-2 is coupled to a trigger input of a second pulse generator 420-2. The pulse output from the second pulse generator 420-2 is coupled to a second edge aligner 430-2. The output of the second edge aligner 430-2 is coupled to a second delay line 440-2.

The single ended output from the second delay line 440-2 is fed back to the second feedback control multiplexer 414-2. The taps in the second delay line 440-2 are coupled to a second input of the first path selection multiplexer 450. Similarly, the single ended delayed pulse is coupled to a second input of the second path selection multiplexer 452.

After both UP and DOWN go high, which denotes the end of an UP-DOWN pair, the Flush signal goes low for a short period allowing zero into the delay lines. This action clears the delay line and resets it for the next measurement.

Feedback control: 'FB-U_ctrl' is for the branch of the circuit for input 'UP' and 'FB-D_ctrl' is for the branch of the circuit for input 'DOWN'. Whichever input, UP or DOWN, comes first its feedback control signal goes high allowing pulse recycling. The feedback control signal goes low when the UP-DOWN pair finishes.

The Sel signal at the control input of the first path selection multiplexer 450 controls which delay line will be read. If UP comes before DOWN, the output of the delay line for the UP input is connected to the Fetch register 460 and the other way if DOWN leads UP.

If UP leads DOWN the Sel_1 control signal allows FB-U to pass through the second path selection multiplexer 452 it controls and the FB-D if DOWN leads UP.

The Sel_2 signal goes high with a start signal that is triggered by the earlier of UP or DOWN, |UP-DOWN|, allowing the selected delayed pulse into counter 470. The Sel_2 signal goes low, thus blocking pulse, and its rising edge signifies the end of an UP-DOWN pair. Thus in a sense it enables the counter 470 when needed.

In operation, both the first and second processing paths are triggered by the respective UP and DOWN signals from the PFC. The trigger signal at each processing path triggers a pulse generator. The pulse from the pulse generator is coupled to a tapped delay line. The output from the tapped delay line is fed back to the trigger input of the pulse generator, such that the delayed pulse operates to retrigger the pulse generator. Each full transition of the pulse though the delay line increments a counter. At the end of the conversion period, the total delay can be determined to be the value of the counter multiplied by the delay line delay plus the fractional transition of the pulse through the delay line, which can be determined by examining the taps of a tapped delay line. A selector controller determines whether the counter and tapped delay register stores values from the first or second processing path.

In the TDC 400, before an UP-DOWN pair starts, 'Flush' and 'Feedback' control signals are controlled such that the multiplexer they control will let the 'UP' and 'DOWN' input pass through to flush out the contents of the delay lines 440-1 and 440-2 and to reset the counter 470.

In response to the rising edges of 'UP' and 'DOWN' the corresponding pulse generator (PG) 420-1 and 420-2 generates a pulse of fixed duration, independent of the UP or DOWN high period. This pulse then goes through a respective edge-aligner (EA) 430-1 and 430-2 which time aligns rising and falling edges at its output. Rising and falling edges are utilized within the differential delay line for the phase difference measurement. After edge alignment, the pulse goes into the delay line 440-1 or 440-2 for magnitude measurement.

Whichever input, UP or DOWN, comes first its corresponding feedback control signal goes high after the rising edge passes through the feedback multiplexer 414-1 or 414-2. However, feedback control signal corresponding to the input that arrives later stays low even after its rising edge arrives. This way only the pulse arriving first is allowed to run through the delay line and loop back if phase difference is greater than delay line time length. The later arriving pulse, UP or DOWN, is used to read the delay line of the leading signal and therefore need not be allowed to loop back.

Pulse output of the delay line 440-1 or 440-2 of the input which arrives first is connected to the counter 470 input through multiplexers 452 and 454 controlled by 'Sel_1' and 'Sel_2'. If the phase difference is more than a full delay line time duration, the delayed pulse coming out of the delay-line 440-1 or 440-2 goes into the counter 470 incrementing its count. This delayed pulse also loops back and runs again through its respective delay line 440-1 or 440-2. In the embodiment of FIG. 4A, the delayed pulse retriggers the pulse generator. This cycle repeats until the second UP or DOWN input arrives. The second input signifies end of the current UP-DOWN pair and the control signal 'Sel_2' goes low, blocking the counter's input. At this instant the relevant delay line can also be read, by the input arriving later, and its state is stored in flip-flops or other registers in the delay line.

When the next UP-DOWN pair starts the counter reading is stored in an intermediate layer of flip-flops and from there it is read at the following FREF edge. The 'Sel' control signal connects the selected delay line output (flip-flop outputs) to fetch register 460. The fetch register 460 can be, for example, a group of flip-flops clocked by FREF which reads the delay line output. Thus, at every FREF edge TDC 400 outputs C<0:4> and D<0:47> is updated.

Selection controller 480 can be implemented as one or more modules that are configured to generate the various control signals based on the UP, DOWN, and FREF signal. FIGS. 11-15 include some examples of modules within the selection controller 280.

Figure 4B:
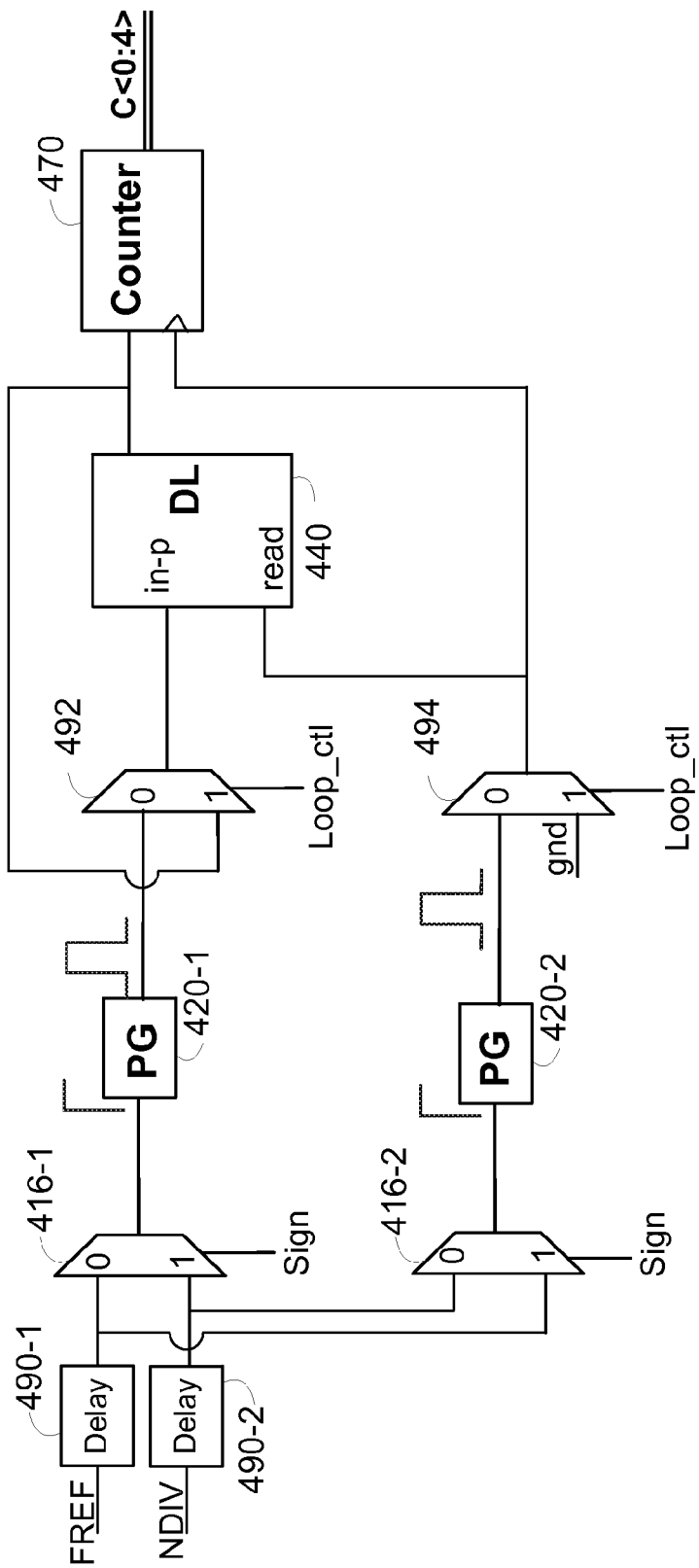
FIG. 4B is a simplified functional block diagram of an embodiment of a phase to digital converter.

FIG. 4B is a simplified functional block diagram of an alternative embodiment of a phase to digital converter 230, such as can be used in the ADPLL of FIG. 2. The phase to digital converter 230 embodiment of FIG. 4B is similar to the magnitude converter 400 of FIG. 4A. However, the phase to frequency converter 230 of FIG. 4B can be configured to perform substantially the entire phase to digital conversion process without the need for a phase to frequency converter and without the need for symmetric processing paths. A first signal processing path includes elements that determine the digital value of the phase difference during the time period defined by the second processing path.

Some portions of the phase to frequency converter 230 of FIG. 4B have been omitted for the sake of clarity. For example, the hardware for flushing the delay line 440 is omitted, but can be similar to the hardware illustrated in FIG. 4A. Similarly, the hardware associated with reading the status of the delay line 440 is omitted from the block diagram, but can be substantially similar to the configuration shown for the magnitude converter of FIG. 4A.

The phase to digital converter (PDC) 230 of FIG. 4B includes a single delay path and feedback path. The PDC 230 determines the digital value in much the same manner as the converter illustrated in FIG. 4A, but without the symmetric paths. A counter 470 stores a count value that indicates a number of full transitions of the pulse though the delay line, and the value read from the delay line value indicates the fractional part of the transition of the pulse through the delay line 440.

The PDC 230 includes a first fixed delay 490-1 and a second fixed delay 490-2 that operate to delay the reference clock and the divided signal, respectively. The fixed delays 490-1 and 490-2 are used to introduce a slight delay that permits the processing of the sign value that is used to control selection of the signals through the two signal processing paths. The outputs from the fixed delays 490-1 and 490-2 are coupled to inputs of a first path selection multiplexer 416-1 and inputs of a second path selection multiplexer 416-2.

The first processing path includes the first path selection multiplexer 416-1. The output of the first path selection multiplexer 416-1 is substantially the first arriving signal transition, whether originating from the reference clock or divided signal. The output from the first path selection multiplexer 416-1 is coupled to an input of a first pulse generator 420-1. The output of the first pulse generator 420-1 is coupled to first input of a loop multiplexer 492 that is configured to select one of the pulse generator output or a delayed pulse output, corresponding to the output from the delay line 440.

The output of the loop multiplexer 492 is coupled to the delay line 440. The delay line 440 couples the delayed pulse output to an input of the counter 470. Each pulse output from the delay line 440 increments the count value in the counter 470. The delay line 440 couples the delayed pulse output to the second input of the loop multiplexer 492.

The loop multiplexer 492 is initially configure to select the first pulse generator 420-1 output at the start of each PDC conversion cycle. Following the initial pulse transition through the loop multiplexer 492, the loop control signal that controls the input selected by the loop multiplexer 492 controls the loop multiplexer 492 to select the second, feedback input. The loop multiplexer 492 continues to select the feedback input until the termination of the conversion cycle, as indicated by the second processing path.

The inputs to the second path selection multiplexer 416-2 are reversed relative to the inputs to the first path selection multiplexer 416-1. The signal selection control for both multiplexers 416-1 and 416-2 is coupled to the sign signal. Thus, the second path selection multiplexer 416-2 in the second processing path operates to select the second arriving signal.

The output from the second path selection multiplexer 416-2 is coupled to an input of a second pulse generator 420-2. The output of the second pulse generator 420-2 is coupled to a first input of a conversion control multiplexer 494. The output of the conversion control multiplexer 494 is coupled to the read input of the delay line 440 as well as to the clock or register input of the counter 470.

A low to high transition from the output of the conversion control multiplexer 494 is the conversion termination signal that indicates the end of the conversion cycle, and can operate to clock the tapped delay line values to registers and clock the counter 470 value to a register.

The conversion control multiplexer 494 is initially configure to select a predetermined value, such as a low, or zero, value at the start of each PDC conversion cycle. The conversion control multiplexer 494 operates, based on the loop control signal, to select the output from the second pulse generator 420-2 once the pulse generator output in the first processing path has entered the delay line 440. The use of the second pulse generator 420-2 and the conversion control multiplexer 494 also helps to match the propagation delays experienced by the control signals to the propagation delays of the initial signal in the first signal processing path.

At the termination of the conversion cycle, the digital value of the phase difference is given by the counter value and the value from the tapped delay line 440. The counter value indicates the number of full transitions of a pulse though the delay line and the value f the tapped delay line 440 indicates the fractional transition of the pulse through the delay line 440.

Figure 5:
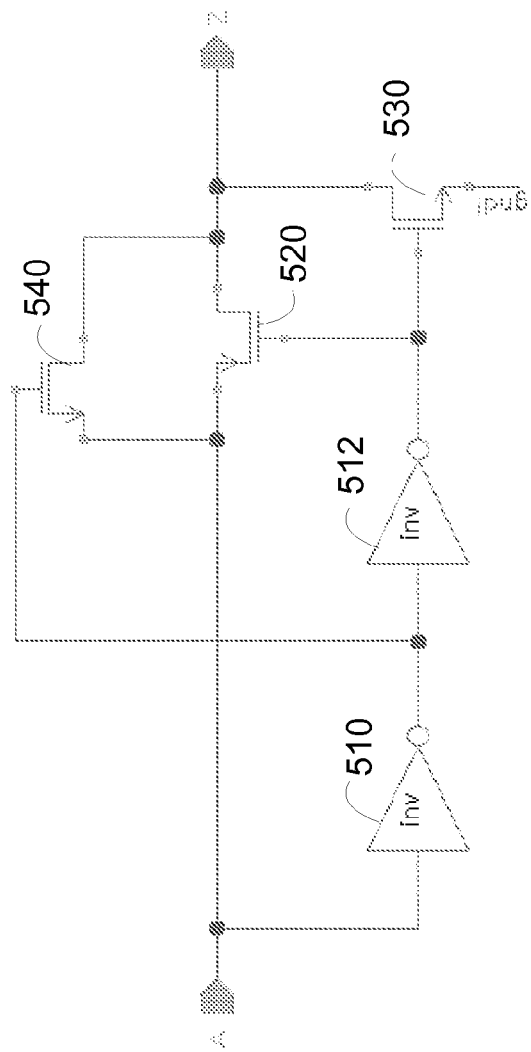
FIG. 5 is a simplified functional block diagram of an embodiment of a pulse generator.

FIG. 5 is a simplified functional block diagram of an embodiment of a pulse generator 420, which can be used in the TDC of FIG. 4A or the PDC of FIG. 4B. The pulse generator 420 is configured to generate a pulse of fixed width in response to a rising edge at its input. The width of the pulse can be configured to be virtually any width that is less than the full delay of the delay line. The pulse generator 420 of FIG. 5 is configured to provide a narrow pulse width on the order of 150 pS. Other pulse generator configurations can be configured to provide pulse widths on the order of 370 pS or some other duration.

The pulse generator 420 includes a first inverter 510 having an input coupled to the pulse generator 420 input. The source of a p-type FET 520 and the source of an n-type FET 540 are also coupled to the pulse generator 420 input.

The output from the first inverter 510 is coupled to an input of a second inverter 512. The output from the first inverter 510 is also coupled to the gate of the n-type FET 540. The output from the second inverter 512 is coupled to the gate of the p-type FET 520 and to the gate of a pull down FET 530 that has its source coupled to ground or voltage return. The drains for the p-type FET 520, n-type FET 540, and pull down FET 530 share a common connection and are common to the output of the pulse generator 420.

Starting from an initial low state, the p-type FET 520 is not conducting, the pull down FET 530 is not conducting, and the n-type FET 540 is conductive, thereby coupling and reinforcing the low input state to the output.

At the rising edge of an input signal, the first inverter 510 transitions its output to a low state after a propagation delay. This creates a negative gate source potential on the n-type FET 540, thereby transitioning it to a high impedance state.

The p-type FET 520 experiences a negative gate source potential prior to the signal propagating through the second inverter 512. During this time period the p-type FET 520 conducts and couples the high input level to the output.

The transition of the first inverter 510 to the low state causes the output of the second inverter 512 to transition to a high state after a propagation delay. As the output of the second inverter 512 transitions high, the voltage at the gate of the p-type FET 520 increases, thereby cutting off conduction of the p-type FET 520. The transition of the output of the second inverter 512 to a high state also causes the pull down FET 530 to conduct, thereby pulling down the output and providing a path from the output to ground to prevent a floating output.

A transition at the input from a high state to a low state does not cause any change of state at the output of the pulse generator 420, but does cause the pull down FET 530 to transition to a high impedance state. However, the n-type FET transitions to a conductive state, thereby providing a pull down path for the pulse generator 420 output.

Figure 6:
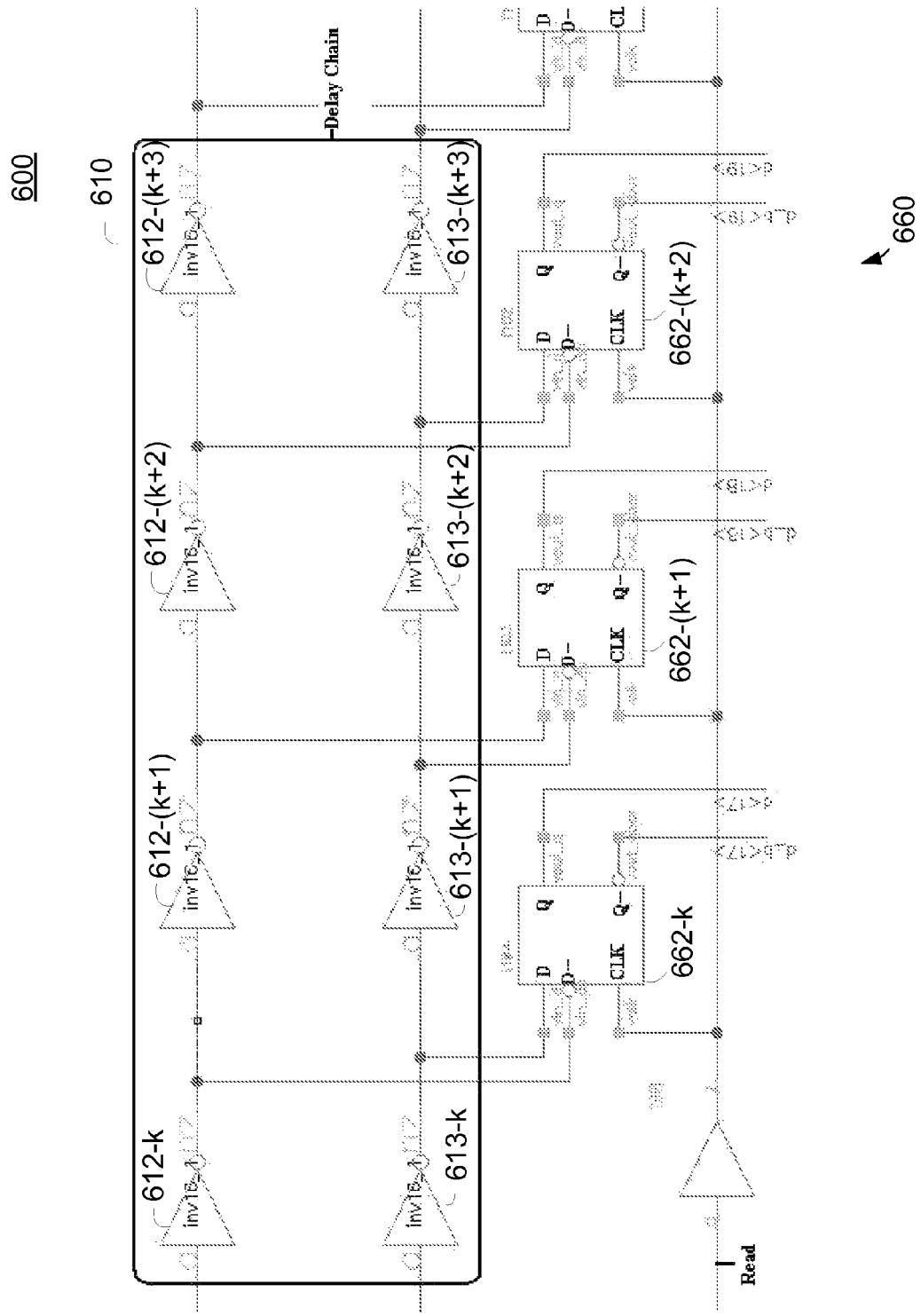
FIG. 6 is a simplified functional block diagram of an embodiment of a tapped delay line.

FIG. 6 is a simplified functional block diagram of an embodiment of a portion of a tapped delay line 600. The portion of the tapped delay line 600 can be, for example, a portion of a delay line in the TDC of FIG. 4A.

The delay line 600 can be configured with three inputs. Two of the inputs correspond to differential inputs that are coupled to the chain of delay elements. A third input receives a 'Read' signal, which upon its arrival latches the state of the delay chain. The state of the delay elements can later be read into or otherwise latched into the fetch register block at the FREF edge.

The delay line 600 of FIG. 6 has a resolution of 22 ps, which is almost the same as the minimum logic level regenerative delay obtainable in 65 nm CMOS process and which in turn is substantially the same as the propagation delay of a native inverter. This delay resolution is substantially half of the minimum delay through a buffer, which is usually made up of two inverters. In order to be able to get resolution improvement due to usage of an inverter instead of buffer as a delay element, its even-odd characteristic should be matched, i.e. rising and falling times should be the same.

The delay chain 610 is implemented using balanced inverters, e.g. 612a, 612b, configured in series. The delay chain 610 is implemented using two parallel inverter chains. The inverter chains are alternately read by differential flip-flops, e.g. 662-k, with very narrow (~2 ps) and balanced metastability window. The kth D flip flop 662-k following an odd number of inverters has its D input coupled to a first inverter chain and its D-input coupled to a corresponding point on the second parallel inverter chain. The (k+1) D flip flop, 662-(k+1), has its D input coupled to the second parallel inverter chain following the (k+1) inverter, 612-(k+1), and its D-input coupled to the first inverter chain following the (k+1) inverter, 613-(k+1). In this manner, the registered output from each D-flip flop, e.g. 662-k, 662-(k+1), 662-(k+2), has the same polarity and taps the delay line 610 following each delay element.

The delay line 610 can be configured with 48 elements (96 total inverters across two parallel delay chains) and thus nominal time period of approximately 1ns. Two such delay lines 610 are employed by the PDC. In one of the delay lines, a pulse triggered by the UP signal runs through the delay chain and the DOWN signal clocks the flip-flops and reads the delay chain state upon its arrival, whereas, in the other delay line a pulse triggered by the DOWN signal runs through the delay chain and the UP signal clocks the flip-flops, e.g. 662.

A selection controller determines which of the UP and DOWN signals arrived first, and controls relevant delay line from which flip flops the relevant delays are read. The load presented to the 'UP' and 'DOWN' signals by the delay lines are not sign dependent. Thus, any time mismatch due to any non-ideality in the otherwise identical paths for 'UP' and 'DOWN' delay lines 610 appear as simple time offset at the output, which likely does not affect the phase locking.

However, if only one delay line is used and depending on their arrival sequence 'UP' and 'DOWN' pulses are routed to a single Delay chain 610, then a time mismatch due to non-ideality after sign dependent routing determining delay line input will translate into a non-linearity. A mismatch after sign dependent routing changes the transfer function to one having a nonlinearity expressed as jump or offset at the origin.

Figure 7:
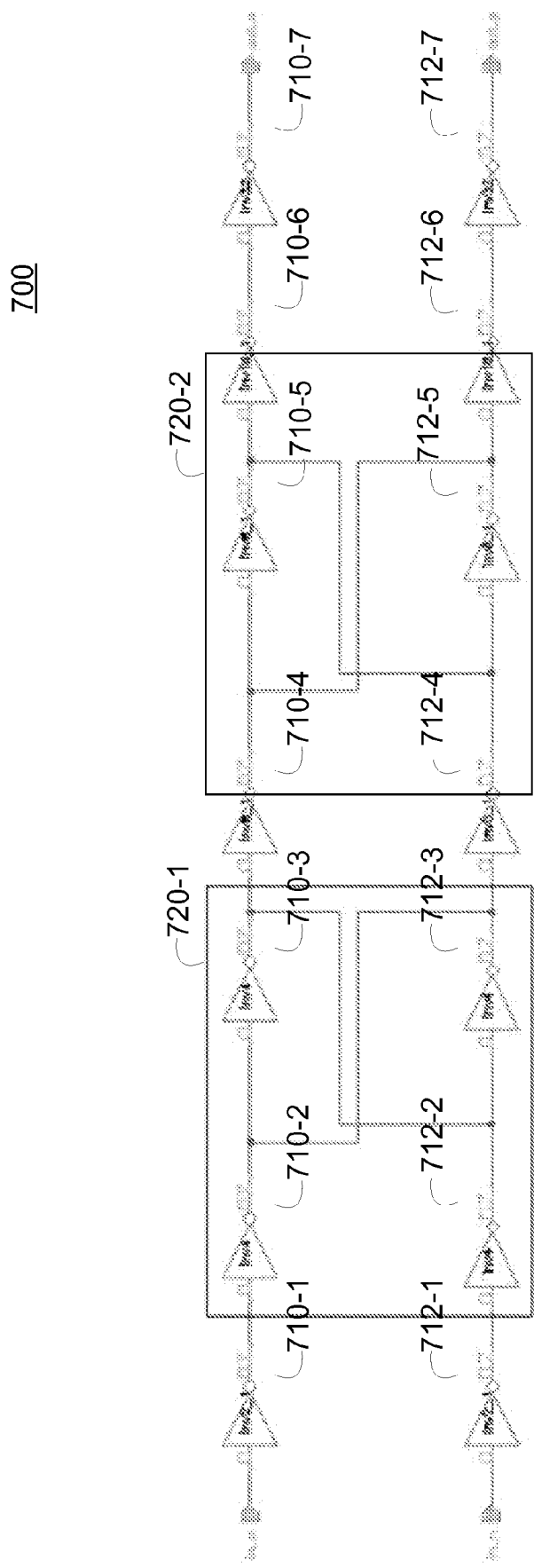
FIG. 7 is a simplified functional block diagram of an embodiment of an edge aligner.

FIG. 7 is a simplified functional block diagram of an embodiment of an edge aligner 430, such as the edge aligner used in the TDC of FIG. 3A.

The edge aligner 430 takes a differential signal having a rising and a falling edge whose transition times have small difference (~30 ps) and provides an edge aligned output where the rising and falling edges are aligned.

The edge aligner 430 includes parallel inverter paths, with cross coupling of signals following particular inverter outputs to equalize the rise and fall delays. The sizes of the inverters used in each inverter chain can be stepped up gradually along the chain to permit the output of the edge aligner 430 to drive buffers which will present large load. In the embodiment of FIG. 7 the portion enclosed in a rectangle is the unit that does the job of edge aligning. Two such blocks have been used for better results. The second edge aligning block can have bigger transistors to stepped up the drive capabilities along the chain.

Figure 8:
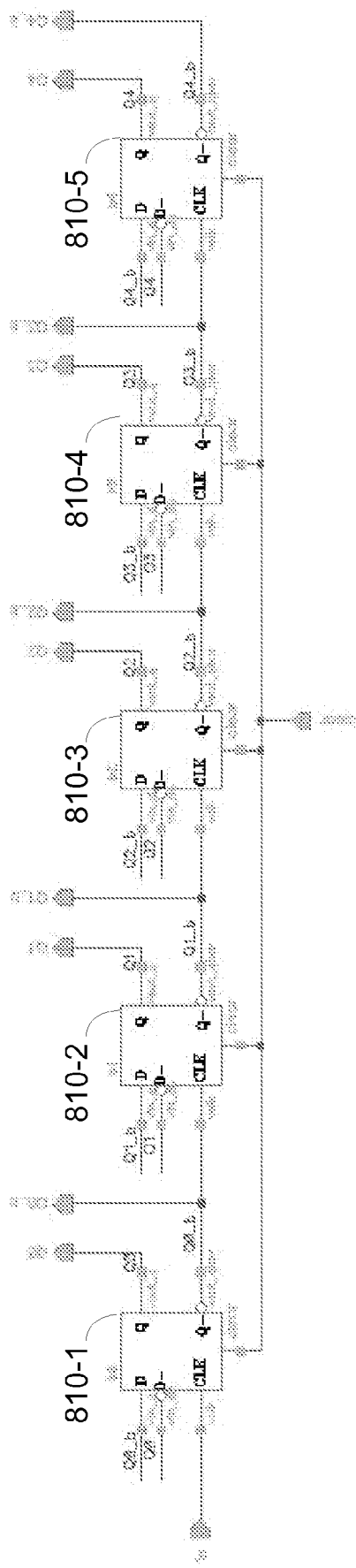
FIG. 8 is a simplified functional block diagram of an embodiment of a counter.

FIG. 8 is a simplified functional block diagram of an embodiment of a counter 800. The counter 800 is configured as a five-bit counter and includes a series configuration of flip flops 810-1 through 810-5. Each flip flop, e.g. 810-1, connects its inverted output back to the D input. Additionally, the output from each flip flop, e.g. 810-1, clocks the next flip flop, e.g. the output from DFF 810-1 clocks DFF 810-2.

The Clear control signal resets the counter 800 before the next counting cycle begins. In an alternative embodiment illustrated in FIG. 9, the Clear control signal occurs after the counter 470 outputs are stored into another layer of flip-flops. The beginning of a counting cycle is unrelated to FREF edge as it can be triggered by an NDIV edge. In that case the previous counter output should be stored before a new cycle begins to prevent the counter value from being lost. Therefore, counter 800 reading is stored on flip-flops (not shown) before next cycle begins from where they are read at the following FREF edge by another layer of flip-flops.

Figure 9:
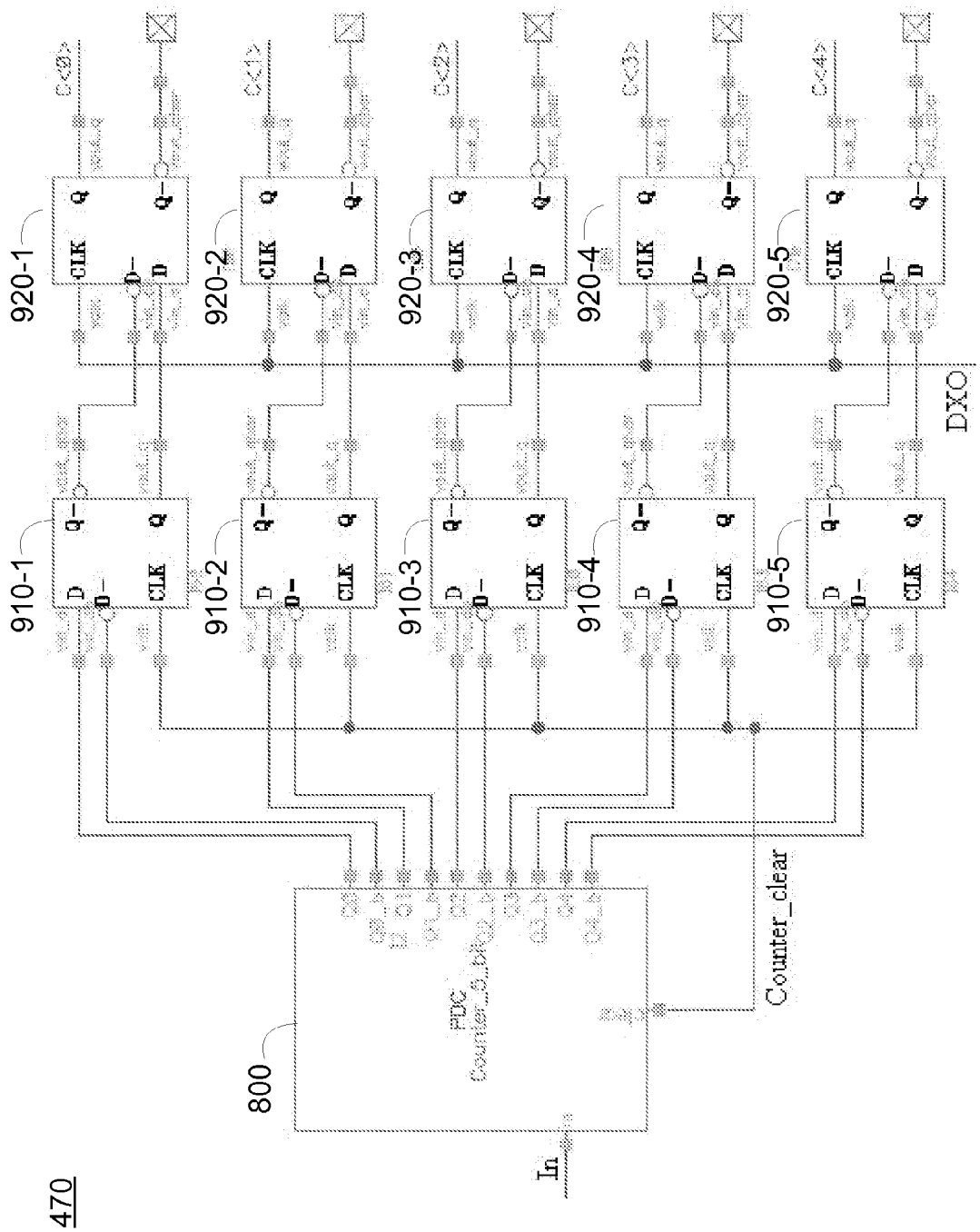
FIG. 9 is a simplified functional block diagram of an alternative embodiment of a counter.

FIG. 9 is a simplified functional block diagram of an alternative embodiment of a counter 470 having multiple layers of flip flops, and can be used as the counter in the TDC of FIG. 4A.

When new UP-DOWN pair begins, a pulse at 'Counter_clear' follows, which stores the counter output on first layer of flip-flops 910-1 through 910-5, and clears the counter 800. Later after FREF edge arrives the outputs from this layer of flip-flops, 910-1 through 910-5, are stored on a second layer of flip-flops 920-1 through 920-5. The second layer of flip flops 920-1 through 920-5 are clocked by DXO, which can be delayed version of the reference clock, FREF. For example, the delayed reference clock DXO, can be implemented by delaying FREF by three flip-flop clk-to-Q delays.

Using the delayed clock is preferable to address the situation in which an UP-DOWN pair starts with FREF. The pulse at 'Counter_clear' follows this FREF edge and the signals output at the first layer of flip-flops 910-1 through 910-5 could be old and not values that updated at the FREF edge.

FIG. 10 is a simplified schematic of an embodiment of a counter clear generator 1000 to use in clearing the counter prior to each TDC conversion operation. The counter clear generator 1000 includes a first D flip flop 1010 having a first buffer 1012 with the buffer 1012 input coupled to the Q output of the first D flip flop 1010 and the buffer 1012 output coupled to the reset input of the first D flip flop 1010. The D input is pulled high. The clock input is coupled to the reference oscillator FREF. The first D flip flop 1010 is thus configured to generate a pulse at each rising edge of FREF.

The Q output from the first D flip flop 1010 is also coupled to the clock input of a second D flip flop 1020. The D input of the second D flip flop 1020 receives the UP signal from the PFD. The Q output of the second D flip flop 1020 is connected to the input of a second buffer 1022. The output of the second buffer 1022 is connected to the reset input of the second D flip flop 1020.

A first OR gate receives the UP and DOWN signals at its input and outputs the logic OR of the two signals. The output of the first OR gate 1030 triggers a first pulse generator 1042, whose output is coupled to an input of a second OR gate 1050.

The Q output of the second D flip flop 1020 triggers a second pulse generator 1044 whose output is coupled to a second input of the second OR gate 1050. The output of the second OR gate is the counter clear signal.

The counter clear generator 1000 generates a pulse following the beginning of every UP-DOWN pair. If this pair starts due to rising edge at UP or DOWN then the pulse is generated at pulse generator P1 which causes the required pulse. However, if this UP-DOWN pair exists because of an activity in previous FREF cycle, than there would be no pulse generated at P1 as output of the first OR gate 1030 preceding it is already high. It is in this case the pulse at P2 from the second pulse generator 1044 is generated. In this situation 'UP' went high at previous FREF edge and has been so since then. At the current FREF edge, 'UP' should be high. Following FREF edge output of the first D flip-flop 1010 goes high and then is reset a short period later (effectively a pulse is generated at its output). This pulse samples 'UP' and if it is high then it will generate a pulse from the second pulse generator 1044 at P2 and at 'Counter_clear'. The reason for delaying FREF edge by one clk-to-Q delay before sampling 'UP' is to avoid pulse generation in situation where NDIV arrives before FREF but very close to it. In this case, delaying FREF will give time for UP to go low. However, using un-delayed FREF won't cause much error as clearly in this situation phase difference is large (such as an acquisition period) and the accuracy is still sufficient for the application.

FIG. 11 is a simplified schematic diagram of an embodiment of a 'Sel' control signal generator. The DOWN signal is coupled to the D input of a first D flip flop DFF 1, 1110, while the UP signal is connected to the clock input. The Q output from DFF 1 1110 is coupled to the D input of a second D flip flop DFF 2, 1120. An inverter 1130 inverts the reference clock FREF and couples the inverted signal to the clock input of DFF 2 1120.

The Sel signal is updated every falling edge of FREF. Thus, it is available half of a reference clock period, TREF, before the FREF edge, for which it is meant. The signal stays valid until half TREF duration past it. If 'UP' leads 'DOWN' then output of from DFF 1 1110 is high a few picoseconds after FREF edge ('UP' and FREF are synchronized) and falling FREF edge following this event will latch this value on DFF 2 1120 which will serve as 'Sel' at next FREF edge.

FIG. 12 is a simplified schematic of an embodiment of a Start/Stop generator 1200, whose Start and Stop signals are used by several other modules within the PDC. These two signals, which are generated from 'UP' and 'DOWN', are used in TDC for generation of various control signals. The rising edge at 'Start' denotes beginning of UP-DOWN pair and the rising edge at 'Stop' denotes the end of the pair.

The UP signal is coupled to first inputs of an OR gate 1210 and an AND gate 1220, while the DOWN signal is coupled to the second inputs of the same gates. The output from the OR gate 1210 represents the Start signal, while the output of the AND gate represents the Stop signal.

FIGS. 13A and 13B illustrate generators 1300 and 1350 for the Sel_1 and Sel_2 signals, respectively, used by the control multiplexers. These two control signals for 2-to-1 multiplexers determine when to allow pulses into the counter and from which delay line. 'Start' and 'Stop' signals are used in generation of these control signals. Sel_1 determines whether the output pulse from the delay line clocked by 'UP' or by 'DOWN' should go into the counter, and Sel_2 determines if the pulse coming out of the delay line should go into the counter or a '0' should go into the counter.

The Sel_1 generator 1300 generates the Sel_1 signal at the /Q output of a D flip flop 1310 having /DOWN at its D input and clocked by the UP signal. A D flip flop 1320 with a buffer 1330 is configured as a pulse generator and is used to supply a reset signal to the Sel_1 D Flip flop 1310 at the rising edge of the stop signal. Initially, after the receipt of the 'Start' signal, 'Sel_1' is low if UP leads DOWN and high if DOWN leads UP. Upon arrival of 'Stop' 'Sel_1' goes high.

The Sel_2 generator 1350 generates the Sel_2 signal based on the Start signal. A first D flip flop 1360 having its D input pulled high uses the Start signal to clock the high level to the Q output at the rising edge of the Start signal. The Q output of the first D flip flop 1360 is used to clock a second D flip flop 1370 having its D input pulled high. Thus, the Sel_2 signal is triggered by the Start signal and is delayed by two clock to Q flip flop delays. A third D-flip flop and buffer 1390 configured as a pulse generator outputs a pulse to the reset inputs of the first and second D flip flops 1360 and 1370 upon a rising edge of the stop signal. Thus, Sel_2 goes high with the rising edge of 'Start' and goes low with the rising 'Stop' edge thus stopping delay line output pulses from going into the counter.

FIGS. 14A and 14B illustrate generators 1400 and 1450 for feedback control signals. These feed-back control signals determine whether the delay line pulse outputs should be looped back to trigger another pulse at the input of their respective delay line. The first arriving input signal, 'UP' or 'DOWN', is allowed to be looped back until the second input or 'Stop' signal arrives. However, the second arriving input does not cause the delayed pulse in its respective processing path to be looped back.

The UP feedback control generator 1400 operates to control the UP feedback path. If 'UP' leads 'DOWN' then output of DFF1 1410 is high following the rising edge of the UP signal. If Sel_2 is high (which happens two clk-to-Q delay after Start) then the delay line in which UP runs through is put in feed-back mode. The AND gate 1412 generates the logical AND of the DFF1 1410 output with 'Sel_2' to ensure that input path is broken to form the feedback path only after ample time is provided for the input pulse to traverse through the feedback multiplexer to the input of the pulse generator, as 'Sel_2' goes high after Start which in turn goes high about one gate delay after start of UP-DOWN pair. The reset flip flop DFF2 1420 is configured with a buffer 1430 to generate a reset pulse following the arrival of the Stop signal.

The DOWN feedback control generator 1450 operates to control the DOWN feedback path, and is configured substantially identical to the UP feedback control generator with the connections to the DOWN and UP signals reversed. If DOWN leads UP then output of DFF3 1460 is high following the rising edge of the DOWN signal. The AND gate 1462 generates the logical AND of the DFF3 1460 output with Sel_2. The reset flip flop DFF4 1470 is configured with a buffer 1480 to generate a reset pulse following the arrival of the Stop signal.

Figure 15:
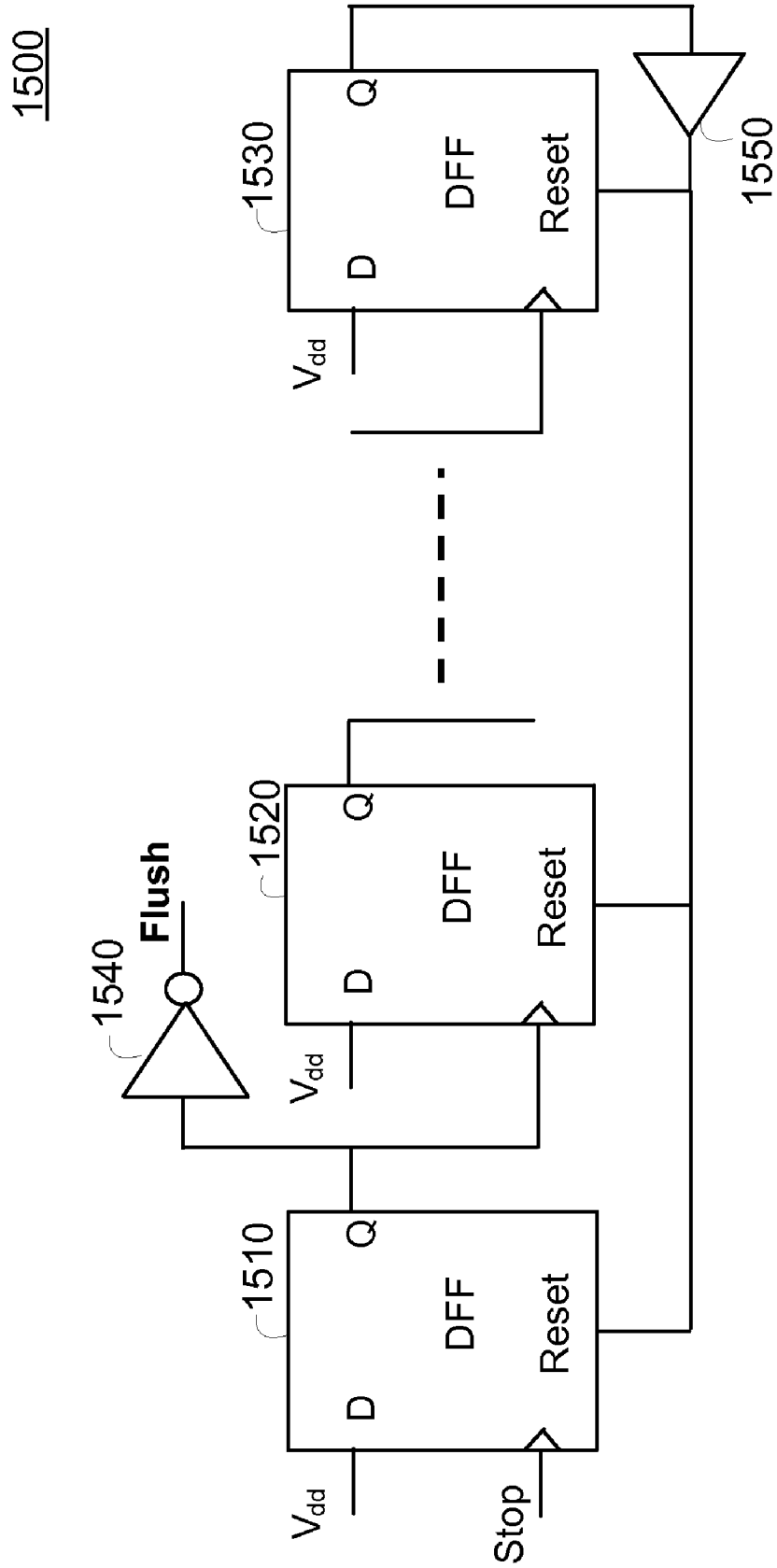
FIG. 15 is a simplified schematic of an embodiment of a flush control generator.

FIG. 15 is a simplified schematic of an embodiment of a flush control generator 1500. The PDC is configured to flush or otherwise clean both delay lines of any pulses after the end of each UP-DOWN pair and before the input signals initiate the next cycle. This is done by disconnecting the feedback and input connections, injecting a logical '0' into the delay line and waiting for a duration longer than delay chain time length before reconnecting the inputs.

The flush control generator 1500 includes a series connection of D flip flops 1510, 1520, 1530, the number of which can be determined based on the duration of the total delay line delay. All D inputs are pulled high. The initial D flip flop 1510 in the chain is clocked by the Stop signal. The output from the first D flip flop 1510 drives an inverter 1540 that outputs the flush control signal. Each subsequent D flip flop, e.g. 1520 and 1543 is clocked by the output from the prior D flip flop. The final D flip flop 1530 drives a buffer 1550 that resets the states of all of the D flip flops in the chain.

Thus, the chain of flip flops is configured to provide an output that transitions high one clock to Q delay and one propagation delay following the Stop signal. The flush control signal resets following N clock to Q delays further delayed by the buffer 1550 propagation delay.

After 'Stop' arrives both the feedback control signals go low breaking feedback paths and then 'Flush' is also set to low, thus breaking the input connection and injecting '0' into the line. 'Flush' goes high a short while later (about five clk-to-Q delay) re-establishing the input connection. Since input connection is broken for short duration, if next UP-DOWN pair will start during this period it will be missed, i.e. there will have a blind zone. In this design because of flush the blind zone has a duration of about 1.5 ns under standard conditions. However, it is important to note that because 'Flush' actually happens after 'Stop' comes and not after an UP-DOWN pair ends, there aren't any blind zones during phase difference longer than one TREF duration.

Figure 16:
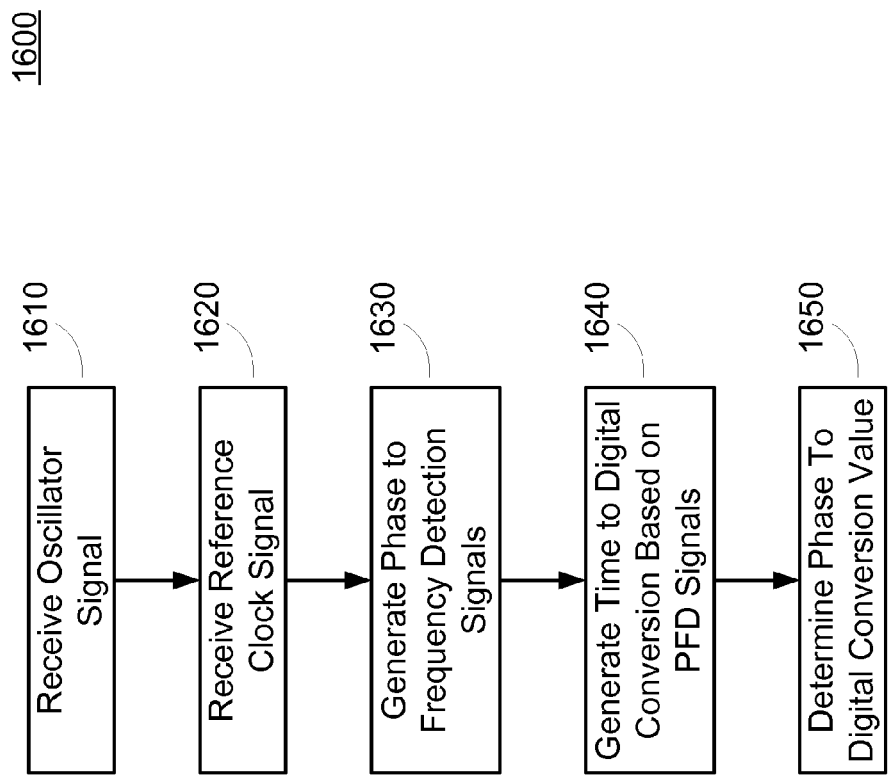
FIG. 16 is a simplified flow chart of an embodiment of a method of phase to digital conversion.

FIG. 16 is a simplified flow chart of an embodiment of a method 1600 of phase to digital conversion. The method 1600 can be implemented, for example, by the phase to digital converter (PDC) shown in the ADPLL of FIG. 2.

The method 1600 begins at block 1610 where the PDC receives the oscillator signal, which may be, for example, a divided signal from a Voltage controlled oscillator. In the ADPLL example of FIG. 2, the oscillator signal received by the PDC is a divided signal from a digital controlled oscillator.

The PDC proceeds to block 1620 where the PDC receives the reference clock signal, which can be, for example a crystal oscillator signal. In an embodiment of an integrated circuit ADPLL, a crystal that is external to the integrated circuit can be used in conjunction with an on-chip reference oscillator. Although the method 1600 illustrates the PDC as receiving the reference clock following receipt of the oscillator signal, the PDC typically receives both signals concurrently and not in series.

The PDC proceeds to block 1630 and generates a Phase to Frequency Detection (PDC) signal or signals based on the oscillator signal and the reference clock. In the embodiment of FIG. 2, the PFD generates an UP signal and a DOWN signal, where the terms 'UP' and 'DOWN' merely distinguish the two signals and are not functionally descriptive.

The PDC proceeds to block 1640 and generates a time to digital conversion based on the PDC signals. In the embodiment of FIG. 2, the TDC is configured to generate a sign of the phase difference and a magnitude of the phase difference using symmetric delay lines, where the digital value is based on one or more of a partial pulse transition through the one of the symmetric delay lines and a number of full transitions through the delay line.

The PDC proceeds to block 1650 and returns the digital value as a sign and magnitude. The sign is determined from the PFD signals and the magnitude value is determined from the PFD signals in conjunction with the delay line processing.

Figure 17:
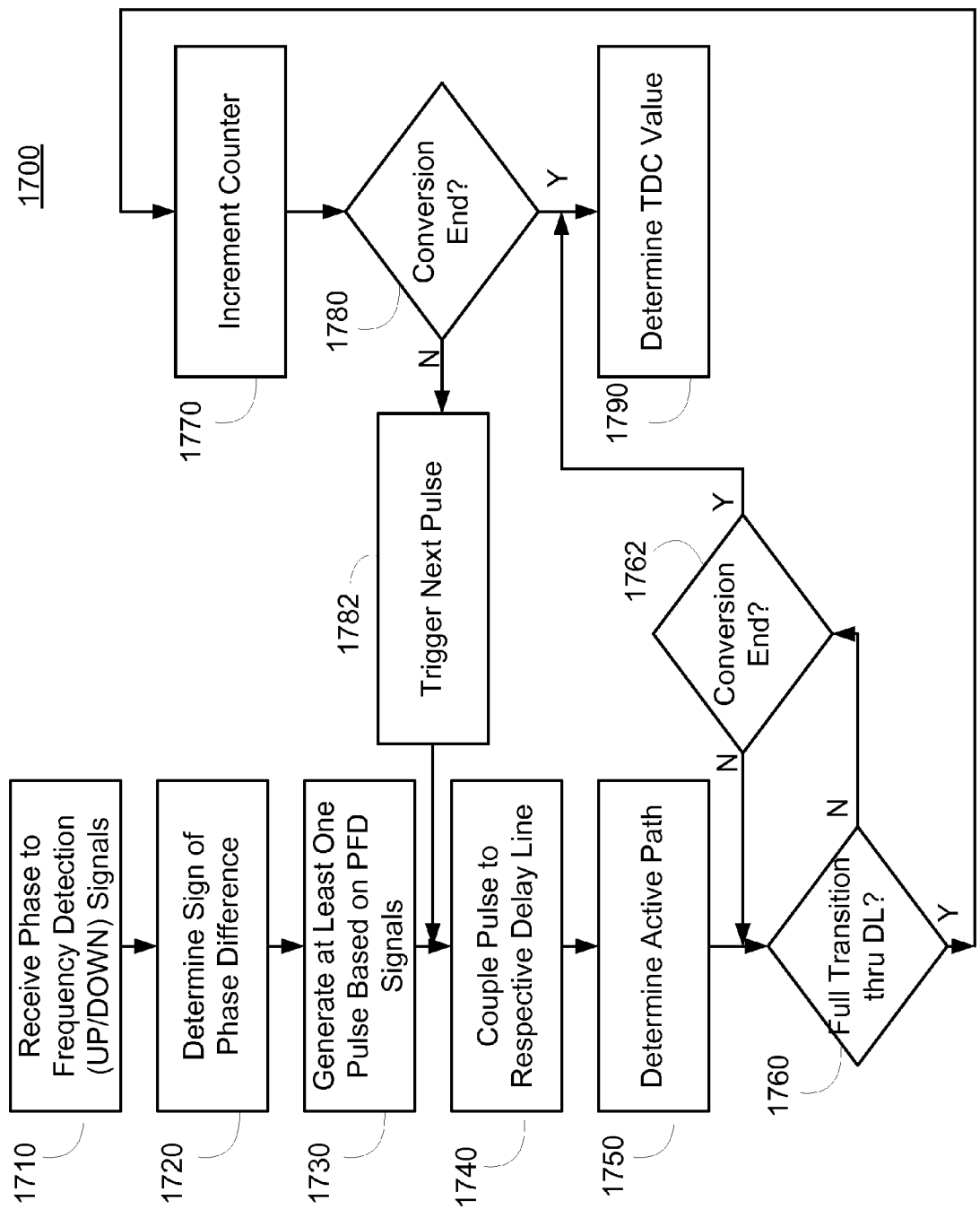
FIG. 17 is a simplified flow chart of an embodiment of a method of time to digital conversion.

FIG. 17 is a simplified flow chart of an embodiment of a method 1700 of time to digital conversion. The method can be performed, for example by the TDC of FIG. 2, where the sign is determined in the manner shown in FIG. 3A and the magnitude is determined in the manner shown in FIG. 4A.

The method 1700 begins at block 1710 where the TDC receives the one or more signals from the PFD. In the embodiment of FIG. 3A, the PFD generates UP and DOWN signals based on the reference clock and oscillator signal and their timing relationship (phase) relative to one another.

The TDC proceeds to block 1720 and determines the sign of the phase difference based on the PFD signals. The sign indicates whether the reference clock leads the oscillator signal or vice versa.

The TDC proceeds to block 1730 and generates at least one pulse based on the PFD signal or signals. In the embodiment of FIG. 4A, the TDC is configured with symmetric processing paths, and the TDC triggers a pulse generator in each path. The TDC triggers a pulse generator based on the UP signal and a second pulse generator in the second, symmetric path, based on the DOWN signal.

The TDC proceeds to block 1740 and couples the pulses to respective delay lines in the respective processing paths. The TDC proceeds to block 1750 and determines which path is an active path. That is, the TDC determines which of the symmetric processing paths to use for the TDC magnitude conversion. The active path represents the path for which a pulse feedback path is valid, which is used if the total time difference exceed a full delay transition.

The TD proceeds to decision block 1760 and determines if a pulse has completely transitioned through the delay line. If not, the TDC proceeds to decision block 1762 to determine if the conversion period has ended. If not, the TDC proceeds back to block 1760 to monitor the pulse's progress through the delay line. If, at decision block 1762 the TDC determines that the conversion period has ended, the TDC proceeds to block 1790 to determine the conversion values.

At decision block 1760, if the pulse has completely traversed the delay line, the TDC proceeds to block 1770 and increments a counter that indicates the number of times a pulse in the active path has fully traversed the delay line. The TDC proceeds to decision block 1780 and determines if the conversion period has ended.

If the conversion period has not yet ended, the TDC proceeds to block 1782 and feeds back the pulse to the input of the delay line. The TDC can perform the pulse feedback by feeding the delayed pulse to trigger a next pulse in the active processing path. After feeding back the delayed pulse to the input of the delay line of the active path, the TDC returns to block 1740.

If, at decision block 1780, the TDC determines that the conversion period has ended, the TDC proceeds to block 1790 and determines the conversion values.

The conversion values can include the sign and the magnitude of the delay. If the magnitude is less than one full delay through the delay line, the magnitude can be a fine phase difference value that is representative of a partial transition of the pulse through the delay line. If the magnitude is greater than one full delay through the delay line, the magnitude can include a coarse phase difference and a fine phase difference. The coarse phase difference can be represented by the number of full transitions through the delay line, which is indicated by the counter value. The fine phase difference is the same as previously described.

If the magnitude is greater than one full delay, an ADPLL may be in acquisition mode, and may not have a need for the resolution provided by the fine phase difference. In such an embodiment, the magnitude may be represented by the coarse phase difference alone, and may omit the contribution due to the fine phase difference.

As used herein, the term coupled or connected is used to mean an indirect coupling as well as a direct coupling or connection. Where two or more blocks, modules, devices, or apparatus are coupled, there may be one or more intervening blocks between the two coupled blocks.

The various illustrative logical blocks, modules, and circuits described in connection with the embodiments disclosed herein may be implemented or performed with a general purpose processor, a digital signal processor (DSP), a Reduced Instruction Set Computer (RISC) processor, an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration.

The steps of a method, process, or algorithm described in connection with the embodiments disclosed herein may be embodied directly in hardware, in a software module executed by a processor, or in a combination of the two. The various steps or acts in a method or process may be performed in the order shown, or may be performed in another order. Additionally, one or more process or method steps may be omitted or one or more process or method steps may be added to the methods and processes. An additional step, block, or action may be added in the beginning, end, or intervening existing elements of the methods and processes.

The above description of the disclosed embodiments is provided to enable any person of ordinary skill in the art to make or use the disclosure. Various modifications to these embodiments will be readily apparent to those of ordinary skill in the art, and the generic principles defined herein may be applied to other embodiments without departing from the spirit or scope of the disclosure. Thus, the disclosure is not intended to be limited to the embodiments shown herein but is to be accorded the widest scope consistent with the principles and novel features disclosed herein.

What is claimed is:

1. A method of phase to digital conversion, the method comprising:
    initiating a first pulse based on an earlier arriving edge of one of a reference clock and an oscillator signal;
    coupling the first pulse through a delay line;
    determining a conversion termination signal based on a later arriving edge of one of the reference clock and the oscillator signal; and determining a digital value of a phase difference between the reference clock and the oscillator signal based on a transition of the first pulse through the delay line.

2. The method of claim 1, wherein determining the digital value comprises determining a tapped delay line value indicative of a fractional delay through the delay line.

3. The method of claim 1, further comprising:
incrementing a counter value based on an output from the delay line; and
coupling the output from the delay line back to the input of the delay line.

4. The method of claim 3, wherein determining the digital value comprises determining the counter value.

5. The method of claim 3, wherein determining the digital value comprises:
determining the counter value as indicating a number of full transitions through the delay line; and
determining a tapped delay line value indicative of a fractional delay through the delay line.

6. The method of claim 1, wherein determining the conversion termination signal comprises initiating a second pulse based on later arriving edge of one of the reference clock and the oscillator signal.

7. The method of claim 6, wherein determining the conversion termination signal further comprises coupling the second pulse through a conversion control multiplexer, and wherein the conversion termination signal comprises an output of the conversion control multiplexer.

8. The method of claim 1, wherein initiating the first pulse based on the earlier arriving edge of one of a reference clock and an oscillator signal comprises:
determining the earlier arriving edge of one of the reference clock and the oscillator signal; and
triggering a first pulse generator based on the earlier arriving edge.

9. The method of claim 8, wherein determining the earlier arriving edge comprises:
coupling the reference clock to a non-inverting input of a D flip flop;
coupling the oscillator signal to an inverting input of the D flip flop;
clocking the D flip flop based on the logical OR of the reference clock and the oscillator signal; and
indicating the earlier arriving edge based on an output of the D flip flop.

10. A method of phase to digital conversion, the method comprising:
generating an UP signal and a DOWN signal based on transitions of an oscillator signal and transitions of a reference clock;
generating a signal pulse based on the UP signal and an other signal pulse based on the DOWN signal; and
generating a digital value of a phase difference based on a transition of at least one of the signal pulse and the other signal pulse through a delay line.

11. The method of claim 10, wherein generating the phase difference comprises generating a fine phase difference value based in part on a partial transition of at least one of the signal pulse and the other signal pulse through a delay line.

12. The method of claim 11, wherein generating the fine phase difference comprises:
coupling at least one of the signal pulse and the other signal pulse to a tapped delay line having series connection of a plurality of delay elements; and
registering a value from each tap of the tapped delay line based on the at least one phase to frequency conversion signal.

13. The method of claim 10, wherein generating the phase difference comprises generating a coarse phase difference value based in part on a number of full transitions of at least one of the signal pulse and the other signal pulse through the delay line.

14. The method of claim 13, wherein generating the coarse phase difference comprises:
generating a read signal based on the at least one phase to frequency detection signal; and
counting a number of full transitions of at least one of the signal pulse and the other signal pulse through the delay line prior to the read signal.

15. The method of claim 10, further comprising generating a sign of the phase difference based on an order of arrival of a selected transition of the oscillator signal relative to a selected transition of the reference clock.

16. The method of claim 10, further comprising aligning a timing of rising transitions to a timing of falling transitions of the signal pulse prior to applying at least one of the signal pulse and the other signal pulse to the delay line.

17. The method of claim 10, further comprising:
incrementing a counter; and
feeding back a delayed signal pulse from an output of the delay line to generate a subsequent signal pulse based on a state of the reference clock.

18. The method of claim 10, further comprising flushing the delay line following generating the phase difference.

19. A method of phase to digital conversion, the method comprising:
receiving an oscillator signal;
receiving a reference clock;
generating at least one phase to frequency detection signal including an UP signal and a DOWN signal based on transitions of the oscillator signal and transitions of the reference clock;
generating a read signal based on the UP signal and the DOWN signal;
generating a first signal pulse based on the UP signal;
generating a second pulse signal based on the DOWN signal;
coupling the first signal pulse to a first delay line;
coupling the second pulse signal to a second delay line;
counting a number of full transitions of one of the first signal pulse or second signal pulse through its respective delay line based on transitions of the UP signal relative to the DOWN signal; and
determining a digital value of a phase difference based on at least one of the number or a partial transition of one of the first signal pulse or the second signal pulse through the respective first delay line and second delay line.

20. The method of claim 19, further comprising aligning a rising transition time and a falling transition time of the of the first signal pulse prior to coupling the first signal pulse to the first delay line.

21. The method of claim 19, further comprising:
flushing the first delay line;
flushing the second delay line;
resetting the number to a predetermined value; and
updating the digital value of the phase difference.

22. The method of claim 19, wherein coupling the first signal pulse to the first delay line comprises coupling the first signal pulse to a first tapped delay line, and wherein the digital value of the phase difference comprises a digital value based on a digital value at each tap of the first tapped delay line.

23. A phase to digital converter comprising:
a path selection multiplexer configured to receive a reference clock signal at a first input and an oscillator signal at a second input, and further configured to output one of the reference clock signal or oscillator signal based on a control input signal;

a first pulse generator having a trigger input coupled to the output of the path selection multiplexer;

a loop multiplexer configured to receive a pulse generator output at a first input and a delayed pulse signal at the second input, and configured to output one of the pulse generator output or the delayed pulse signal based on a loop control signal;

a delay line coupled to the output of the loop multiplexer and configured to output the delayed pulse signal, and further configured to indicate a fractional pulse transition upon receipt of a conversion termination signal; and a counter configured to count a number of pulses output by the delay line and configured to output the number upon receipt of the conversion termination signal.

24. The phase to digital converter of claim 23, further comprising:

a logical OR gate configured to receive the reference clock at a first input, configured to receive the oscillator signal at a second input, and further configured to generate the logical OR of signals at the first input and second input; and a D flip flop having a non-inverting input configured to receive the reference clock, an inverting input configured to receive the oscillator signal, and a clock input coupled to an output of the logical OR gate, and wherein the control input signal comprises an output of the D flip flop.

25. The phase to digital converter of claim 23, wherein the delay line comprises a tapped delay line.

26. The phase to digital converter of claim 23, wherein the phase to digital output comprises the number of pulses output by the delay line if the number is non-zero.

27. The phase to digital converter of claim 23, wherein the phase to digital output comprises the fractional pulse transition.

28. The phase to digital converter of claim 27, wherein the fractional pulse transition is indicated by a temperature coded digital value.

29. A phase to digital converter comprising:

a first signal processing path configured to determine a magnitude of a phase difference between an oscillator signal and a reference clock based on at least one of a fractional transition of a pulse through a delay line and a number of full transitions of the pulse through the delay line; and a sign generator configured to receive the oscillator signal and the reference clock and configured to determine a sign of the phase difference.

30. A phase to digital converter comprising:

a phase to frequency detector configured to generate an UP signal and a DOWN signal based on an oscillator signal and a reference clock;

a pulse generator coupled to the phase to frequency detector and configured to generate a pulse signal based on one of the UP signal and the DOWN signal;

a tapped delay line coupled to the pulse generator;

a counter configured to increment based on an output of the delay line;

a register coupled to the tapped delay line; and a read control generator configured to generate a read signal based on the UP signal and the DOWN signal, and configured to latch a digital value of a phase difference in at least one of the register or the counter.

31. The phase to digital converter of claim 30, further comprising an edge aligner interposed between the pulse generator and the tapped delay line and configured to align a transition time of a rising edge of the pulse signal with a transition time of a falling edge of the pulse signal.

32. The phase to digital converter of claim 30, wherein the tapped delay line comprises a series connection of a plurality of delay elements, and wherein each tap of the tapped delay line is coupled to an output of one of the plurality of delay elements.

33. The phase to digital converter of claim 32, wherein the plurality of delay elements comprises a plurality of non-inverting buffers.

34. The phase to digital converter of claim 30, wherein the output of the delay line is fed back to the pulse generator to retrigger the pulse generator based on a state of the read signal.

35. The phase to digital converter of claim 30, wherein the digital value of the phase difference comprises the register value when the counter holds a zero value.

36. The phase to digital converter of claim 30, wherein the digital value of the phase difference comprises a counter value when the counter holds a non-zero value.

37. A phase to digital converter comprising:

means for generating a phase to frequency detection signal including an UP signal and a DOWN signal based on transitions of an oscillator signal and transitions of a reference clock;

means for generating a conversion Start signal and a conversion Stop signal based on the UP signal and the DOWN signal;

means for generating a pulse based on one of the UP signal and the DOWN signal;

means for delay coupled to the means for generating the pulse;

means for counting coupled to an output of the means for delay; and means for converting a time to a digital value of a phase difference based on the Start signal and the Stop signal and further based on an output of the means for counting and a fractional transition of the pulse through the means for delay.

38. The phase to digital converter of claim 37, wherein the means for delay comprises:

a tapped delay line; and a multi-bit register, wherein each bit of the multi-bit register corresponds to a tap of the tapped delay line.

39. The phase to digital converter of claim 37, further comprising means for latching fractional transitions through the means for delay to determine the fractional transition, and wherein the digital value of the phase difference comprises a coded output from the means for latching.

40. The phase to digital converter of claim 37, wherein the digital value of the phase difference comprises a non-zero output of the means for counting.

41. An all digital phase locked loop (ADPLL) comprising:

a digital controlled oscillator (DCO);

a digital divider having an input coupled to the DCO and an output configured to provide a digital divided output signal;

a phase to frequency detector having a first input coupled to a reference oscillator clock and a second input coupled to the output of the digital divider, the phase to frequency detector configured to generate an UP signal and a DOWN signal based on the digital divided output signal and the reference oscillator clock;

a phase to digital converter having a first input receiving the UP signal, a second input receiving the DOWN signal, and a third input receiving the reference oscillator clock, the phase to digital converter configured to generate a pulse signal based on one of the UP signal or the DOWN signal and further configured to determine a digital value of a phase difference between the digital divided output signal and the reference oscillator clock based on at least one of full transitions of the pulse signal through a delay line and partial transitions of the pulse through the delay line; and a digital loop filter having an input coupled to an output of the phase to digital converter and an output coupled to a control input of the DCO.

42. The ADPLL of claim 41, further comprising:
a modulator; and
a combiner with a first input coupled to the output of the digital loop filter, a second input coupled to an output of the modulator, and an outptu6 coupled to the control input of the DCO.

43. The ADPLL of claim 41, wherein the digital divider comprises a fractional divider.

44. The ADPLL of claim 41, wherein the phase to digital converter comprises:
- a pulse generator coupled to the phase to frequency detector and configured to generate the pulse signal based on one of the UP signal and the DOWN signal;
- a counter configured to increment based on an output of the delay line;
- a register coupled to the delay line and configured to determine a digital value representative of the partial transitions of the pulse signal through the delay line; and
- a read control generator configured to generate a read signal based on the UP signal and the DOWN signal, and configured to latch a digital value of the phase difference in at least one of the register or the counter.

* * * * *